(12) United States Patent
Jonishi et al.

(10) Patent No.: US 10,396,775 B2
(45) Date of Patent: Aug. 27, 2019

(54) SEMICONDUCTOR DEVICE FOR HIGH-VOLTAGE CIRCUIT

(71) Applicant: FUJI ELECTRIC CO., LTD., Kawasaki-shi, Kanagawa (JP)

(72) Inventors: Akihiro Jonishi, Matsumoto (JP); Masashi Akahane, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/712,086

(22) Filed: Sep. 21, 2017

(65) Prior Publication Data

US 2018/0019742 A1    Jan. 18, 2018

Related U.S. Application Data

(60) Division of application No. 14/853,972, filed on Sep. 14, 2015, now Pat. No. 9,793,886, which is a (Continued)

(30) Foreign Application Priority Data

Sep. 2, 2013   (JP) .................................. 2013-181241

(51) Int. Cl.
*H03K 17/0812* (2006.01)
*H01L 27/088* (2006.01)
(Continued)

(52) U.S. Cl.
CPC .................. *H03K 17/08128* (2013.01); *H01L 21/823493* (2013.01); *H01L 27/0207* (2013.01);
(Continued)

(58) Field of Classification Search
CPC ........................... G06K 9/00771; H04M 11/04
(Continued)

(56) References Cited

U.S. PATENT DOCUMENTS 5,359,244 A    10/1994   Hopkins
5,801,418 A    9/1998    Ranjan
(Continued)

FOREIGN PATENT DOCUMENTS

JP        3214818 B2    10/2001
JP    2004-006555 A     1/2004
(Continued)

OTHER PUBLICATIONS

Tomoyuki Yamazaki et al., "New high voltage integrated circuits using self-shielding technique", Proc. of The 11th Int. Symp. On Power Semiconductor Devices and ICs IEEE and IEEJ, May 1999, pp. 333-336.

*Primary Examiner* — John W Poos
(74) *Attorney, Agent, or Firm* — Rabin & Berdo, P.C.

(57) ABSTRACT

Provided is a semiconductor device capable of preventing a malfunction of a high-side gate driver circuit that is caused by a negative voltage surge. A diode is connected between a p-type bulk substrate configuring a semiconductor layer, and a first potential (GND potential), and a signal is transmitted from a control circuit that is formed in an n diffusion region configuring a first semiconductor region through a first level down circuit and a first level up circuit to a high-side gate driver circuit that is formed in an n diffusion region configuring a second semiconductor region. As a result, a malfunction of the high-side gate driver circuit that is caused by a negative voltage surge can be prevented.

18 Claims, 28 Drawing Sheets

Related U.S. Application Data continuation of application No. PCT/JP2014/004481, filed on Sep. 1, 2014.

(51) Int. Cl.
| | |
|---|---|
| *H01L 21/8234* | (2006.01) |
| *H01L 27/07* | (2006.01) |
| *H01L 27/02* | (2006.01) |
| *H01L 27/06* | (2006.01) |
| *H01L 29/06* | (2006.01) |
| *H01L 29/739* | (2006.01) |
| *H03K 17/20* | (2006.01) |

(52) U.S. Cl.
CPC ...... *H01L 27/0629* (2013.01); *H01L 27/0727* (2013.01); *H01L 27/088* (2013.01); *H01L 29/0615* (2013.01); *H01L 29/7393* (2013.01); *H03K 17/20* (2013.01); *H01L 29/063* (2013.01)

(58) Field of Classification Search
USPC .......................... 327/108, 109, 110, 111, 112
See application file for complete search history.

(56) References Cited

U.S. PATENT DOCUMENTS

| | | | |
|---|---|---|---|
| 5,894,156 | A | 4/1999 | Terashima et al. |
| 6,211,706 | B1 | 4/2001 | Choi et al. |
| 6,967,518 | B2 | 11/2005 | Giacomini et al. |
| 2002/0195659 | A1 | 12/2002 | Jimbo et al. |
| 2009/0147422 | A1 | 6/2009 | Nakahara |
| 2011/0101935 | A1 | 5/2011 | Nakahara |
| 2011/0199346 | A1 | 8/2011 | Ko et al. |
| 2012/0267750 | A1* | 10/2012 | Imai ............... H01L 27/0248 257/495 |
| 2013/0127524 | A1 | 5/2013 | Yamaji |
| 2013/0265029 | A1 | 10/2013 | Akiyama |
| 2014/0001546 | A1 | 1/2014 | Bode et al. |

FOREIGN PATENT DOCUMENTS

| | | |
|---|---|---|
| JP | 3917211 B2 | 5/2007 |
| JP | 2009-147994 A | 7/2009 |
| JP | 2010-154721 A | 7/2010 |
| JP | 4574601 B2 | 11/2010 |
| JP | 2011-101189 A | 5/2011 |
| JP | 2011-166153 A | 8/2011 |
| JP | 2014-096579 A | 5/2014 |
| WO | WO-2012/124677 A1 | 9/2012 |

* cited by examiner

SEMICONDUCTOR DEVICE FOR HIGH-VOLTAGE CIRCUIT

This is a divisional application of U.S. application Ser. No. 14/853,972, filed on Sep. 14, 2015, and allowed on Jun. 16, 2017, which is a continuation under 35 U.S.C. 120 of International Application PCT/JP2014/004481 having the International Filing Date of Sep. 1, 2014, and having the benefit of the earlier filing date of Japanese Application No. 2013-181241, filed on Sep. 2, 2013. Each of the identified applications is fully incorporated herein by reference.

TECHNICAL FIELD

The present invention relates to a semiconductor device such as a high voltage IC, which is a high voltage integrated circuit device.

BACKGROUND ART

In order to drive the gates of the semiconductor power switching elements such as IGBTs configuring a power conversion bridge circuit of a conventional power converter such as an industrial inverter, an isolation transformer or a photo coupler is used to create electrical insulation between the controller and the gate driver circuit. In recent years, however, for the purpose of cost reduction, a high voltage integrated circuit device (referred to as "HVIC," hereinafter) that does not require electrical insulation has been used mainly for lower capacities.

Non-patent Literature 1 and Patent Literature 1, for example, disclose conventional HVICs. Non-patent Literature 1 discloses a HVIC using a self-isolation process employing a bulk substrate. An example of a conventional HVIC 200 using a self-isolation process is shown in FIGS. 26, 27 and 28.

FIG. 26 is a plan view showing substantial parts of the conventional HVIC 200. The HVIC 200 generally has a high-side gate driver circuit 1137, a level up circuit 1140 including Nch level shifters 1132, an input control circuit 1136, and a high voltage junction terminating structure 1130. There are two Nch level shifters 1132, a level shifter for transmitting a set signal and a level shifter for transmitting a reset signal, each of which is a Nch field effect transistor formed integrally with the high voltage junction terminating structure 1130. Letters HI in the diagram means "high level," LO means "low level," IN means "input," and OUT means "output." A signal at the IN side is based on a GND potential, while a signal at the OUT side is based on a VS potential.

FIG. 27 is a cross-sectional diagram of the substantial parts, taken along line XXVII-XXVII of FIG. 26. In the cross-sectional structure of the conventional HVIC 200, deep n-type diffusion regions, i.e., an n diffusion region 1102 and an n diffusion region 1103, are formed in the front surface of a p-type bulk substrate 1101 (Psub). In addition, the input control circuit 1136 is formed in the front surface of the n diffusion region 1102, and a high-side gate driver circuit 1137 is formed in the front surface of the n diffusion region 1103. The bulk substrate is an original substrate on which the diffusion regions are not yet formed. Relatively shallow p-type diffusion regions, i.e., a p diffusion region 1111 and a p diffusion region 1112 are formed in the front surfaces of the n diffusion region 1102 and the n diffusion region 1103 respectively and partially in order to form the Nch field effect transistors and the like. The p diffusion region 1111 is connected to a ground (GND) terminal, a reference potential of the input control circuit 1136, by a $p^+$ diffusion region 1109. The p diffusion region 1112 is connected to a VS terminal, a reference potential of the high-side gate driver circuit 1137, by a $p^+$ diffusion region 1110. The n diffusion region 1102 is connected to a VCC terminal, a power supply terminal of the input control circuit 1136, by an $n^+$ diffusion region 1107. The n diffusion region 1103 is connected to a VB terminal, a power supply terminal of the high-side gate driver circuit 1137, by an $n^+$ diffusion region 1108. A voltage of 9 V to 24 V, power supply voltage of the high-side gate driver circuit 1137, is applied between the VB terminal and the VS terminal.

A first parasitic diode 1141 and a second parasitic diode 1142 are formed, respectively, in a junction 1102a between the n diffusion region 1102 and the p-type bulk substrate 1101 and a junction 1103a between the n diffusion region 1103 and the p-type bulk substrate 1101.

Hereinafter, the area of the n diffusion region 1103 where the high-side gate driver circuit 1137 is formed is referred to as "high-side circuit region 1135," and the area of the n diffusion region 1102 where the input control circuit 1136 is formed is referred to as "low-side circuit region 1133." In other words, the reference numerals 1103 and 1135 represent the identical region, as well as the reference numerals 1102 and 1133.

The high voltage junction terminating structure 1130 is formed around the high-side circuit region 1135, in which a voltage that is equal to or higher than the potential of the low-side circuit region 1133 by approximately 600 V can be applied to the high-side circuit region 1135. The high voltage junction terminating structure 1130 is configured by a double-RESURF structure with an $n^-$ diffusion region 1105, which is a light n-type diffusion region, a p diffusion region 1120, which is a shallow p-type diffusion region, and the p-type bulk substrate 1101.

The Nch level shifters 1132 are Nch field effect transistors that are formed integrally with the high voltage junction terminating structure 1130. The components of each Nch level shifter 1132 are: an $n^-$ diffusion region 1106 which is deep, light n-type diffusion region configuring a withstand voltage structure and a drain-drift region, a $p^-$ diffusion region 1119 which is a shallow p-type diffusion region configuring the high voltage junction terminating structure 1130, an $n^+$ diffusion region 1116 which is a shallow, dark n-type diffusion region configuring the drain, a $n^+$ diffusion region 1115 which is a shallow, dark n-type diffusion region configuring the source, a p diffusion region 1122 which is a relatively shallow, dark p-type diffusion region configuring the channel, a p+ diffusion region 1114 which is a shallow, dark p-type diffusion region configuring a pickup of a back gate, a gate oxide film 1125, and a gate electrode 1124.

In order to form a level up resistor 1127 between the VB terminal and the drain terminal of each Nch level shifter 1132, the n diffusion region 1103 connected to the VB terminal and the $n^-$ diffusion region 1106 connected to the drain terminal are electrically isolated from each other by a $p^-$ diffusion region 1147.

Note that the n diffusion region 1102 is connected to the VCC terminal by a $p^+$ diffusion region 1121. The VB terminal is connected to the VCC terminal by a bootstrap diode 1129, shown by the dotted line in the diagram. A bootstrap capacitor (a power supply capacitor at the high side) 1138 is connected between the VB terminal and the VS terminal.

FIG. 28 is a representative circuit schematic of the HVIC 200 shown in FIG. 26. Note that the level up circuit 1140 is described only as a set circuit, and a reset circuit is not shown.

An operation of the conventional HVIC 200 for driving a high-side device (high-side power device) of a bridge circuit is described using FIG. 28. As shown in FIG. 27, the VS terminal is connected to a connecting point between a low-side device (low-side power device) and the high-side device that configure the bridge circuit, in which a high-side driver circuit is operated between the VS potential and a VB potential, with the VS potential taken as a reference potential as described above. The VB potential is VS potential+ approximately 9 V to 24 V.

A set signal and a reset signal that are input to the input control circuit 1136 are transmitted through the level up circuit 1140 to the high-side gate driver circuit 1137 that is operated based on the VS potential.

When the set signal is transmitted, the gate of the high-side device of the bridge circuit is turned on, and when the reset signal is transmitted, the gate of the high-side device of the bridge circuit is turned off. During the operation of the HVIC 200, the potential of the VS terminal changes between 0 V to several hundred V.

Also, the high-side gate driver circuit 1137 is configured with a buffer circuit R, an Nch field effect transistor, a Pch field effect transistor, and the like.

In the diagram, the alphabet "a" represents the VB terminal connected to the high-potential terminal of the bootstrap capacitor 1138, "b" the VS terminal connected to the low-potential terminal of the bootstrap capacitor 1138, "c" a connecting terminal connected to the anode of the bootstrap diode 1129, "d" an input terminal for ON/OFF signals, "e" the VCC terminal, "f" an output terminal for ON/OFF signals, "g" the VS terminal connected to an intermediate potential point of the bridge circuit, "h" a Psub terminal, and "i" the GND terminal. The h and i are each a single terminal. These terminals are the terminals of the semiconductor device 200. The small black circles represent the connecting points between the circuits, and the small squares represent the connections to the respective circuit regions.

Patent Literature 1 describes that a more stable operation of an integrated circuit can be realized throughout a wide range applied high voltages, by providing a (diffused or polysilicon) level shift resistor in parallel with a resistor Repi of an epitaxial layer without providing a metal cross over for high voltages (metal lines extending from a low-side region to a high-side region).

Patent Literatures 2 and 3 each disclose a method for preventing a parasitic diode from being biased forward and hence preventing a malfunction of the high-side gate driver circuit 1137 by applying a negative bias to a substrate potential through the use of a negative voltage power supply.

Patent Literature 1: Japanese Patent No. 3214818
Patent Literature 2: U.S. Pat. No. 6,211,706 (Specification)
Patent Literature 3: U.S. Pat. No. 6,967,518 (Specification)
Non-patent Literature 1: Proc. of The 11th Int. Symp. On Power Semiconductor Devices and ICs IEEE and IEEJ, 1999, pp. 333-336

In a case where a load connected to the power devices driven by the HVIC 200 (e.g., IGBTs (Insulated Gate Bipolar Transistors) configuring the bridge circuit) is an inductive load, a negative voltage surge where the VS potential drops instantaneously below the GND potential occurs due to counter electromotive force that is generated in the load as soon as the high-side power device is turned off.

When the voltage (absolute value) of the negative voltage surge is greater than the voltage between the VB terminal and the VS terminal, the VB potential also drops below the GND potential, in addition to the VS potential. For instance, when the negative voltage surge is −200 V and the voltage between the VB terminal and the VS terminal is 15 V, the VB potential becomes lower than the GND potential (Psub potential) by 185 V (15 V-200 V).

In the conventional HVIC 200 that uses the self-isolation process described above, the second parasitic diode 1142 is formed between the VB terminal and the GND terminal. When the VB potential drops below the GND potential and the second parasitic diode 1142 is biased forward, causing the voltage thereof to become equal to or greater than a forward voltage of 0.6 V, then electrical conduction occurs in the second parasitic diode 1142. Due to this electrical conduction, a surge current flows from the p-type bulk substrate 1101 (Psub) connected to the GND terminal to the n diffusion region 1103 which is the high-side circuit region 1135 connected to the VB terminal. This surge current causes a malfunction of the high-side gate driver circuit 1137. The tolerance to the negative voltage surge of the conventional HVIC 200 is approximately −200 V. In other words, applying a negative voltage surge within this approximately −200 V prevents a malfunction of the high-side gate driver circuit 1137. This problem also occurs in an HVIC that uses a junction isolation process.

The methods described in Patent Literatures 2 and 3 which prevent forward biasing of the parasitic diode by applying a negative bias to the substrate potential using a negative voltage power supply, require a negative voltage power supply, bringing about a problem that increases the costs significantly.

SUMMARY

An object of the present invention is to solve the foregoing problems and provide a semiconductor device capable of preventing a malfunction of a high-side gate driver circuit that is caused by a negative voltage surge.

In order to achieve this object, a semiconductor device according to one aspect of the present invention has: a semiconductor layer of a first conductivity type; first and second semiconductor regions of a second conductivity type which are disposed in a front surface layer of the semiconductor layer or on the semiconductor layer and have first and second parasitic diodes formed between the semiconductor layer and the first and second semiconductor regions respectively; a control circuit that is disposed in the first semiconductor region and operated based on a first potential, a potential of the first semiconductor region; a gate driver circuit that is disposed in a third semiconductor region of the first conductivity type disposed in a front surface layer of the second semiconductor region and is operated with a second potential as a reference potential, the second potential being a potential of the second semiconductor region; a first diode that is disposed in a surge current path formed by a negative surge voltage and passing through the second parasitic diode, and that has reverse characteristics to a surge current; and a first level shift circuit that converts a first gate control signal output from the control circuit and having the first potential as a reference potential into a third gate control signal based on the second potential, and outputs the third gate control signal to the gate driver circuit.

The present invention can provide a semiconductor device capable of preventing a malfunction of a high-side gate driver circuit that is caused by a negative voltage surge.

DETAILED DESCRIPTION

Figure 1:
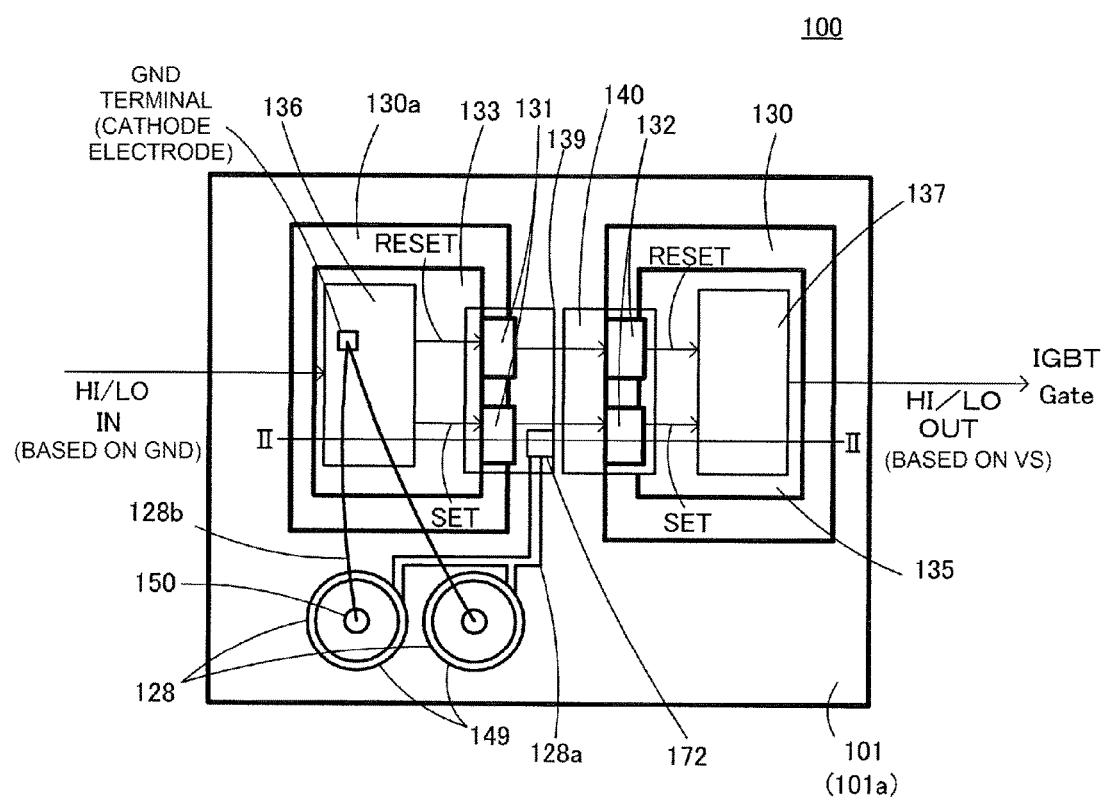
FIG. 1 is a plan view showing substantial parts of a semiconductor device according to a first embodiment of the present invention.

Embodiments are described hereinafter as examples of the present invention.

In the present description and accompanying drawings, alphabets "n" and "p" denoting layers and regions mean that electrons and holes in these layers and regions are a plurality of carriers. Additionally, symbols "+" and "−" accompanying "n" and "p" mean that these regions and layers have lower impurity concentrations than semiconductor regions with no "+" or "−."

Note that, in the following descriptions and accompanying drawings of the first to eleventh embodiments, same reference numerals are used to describe the same components, and overlapping descriptions are omitted accordingly.

Furthermore, for the purpose of simple illustration and understanding of the present invention, the descriptions and accompanying drawings of the first to eleventh embodiments do not illustrate the components on accurate scales or dimensions. As long as the present invention does not depart from the gist thereof, the present invention is not intended to be limited to the first to eleventh embodiments.

In addition, for the purpose of simple illustration of the drawings, FIGS. 2, 3, 5, 6, 12, 16, 25 and 27 out of the accompanying drawings described in the first to eleventh embodiments omit hatchings that indicate cross-sections.

The first to eleventh embodiments each focus on a high voltage integrated circuit device (HVIC) as a representative example of the "semiconductor device" of the present invention.

First Embodiment

FIG. 1 is a plan view showing substantial parts of a semiconductor device 100 according to the present invention. A high voltage integrated circuit device (HVIC) is an aspect of the semiconductor device 100.

Figure 4:
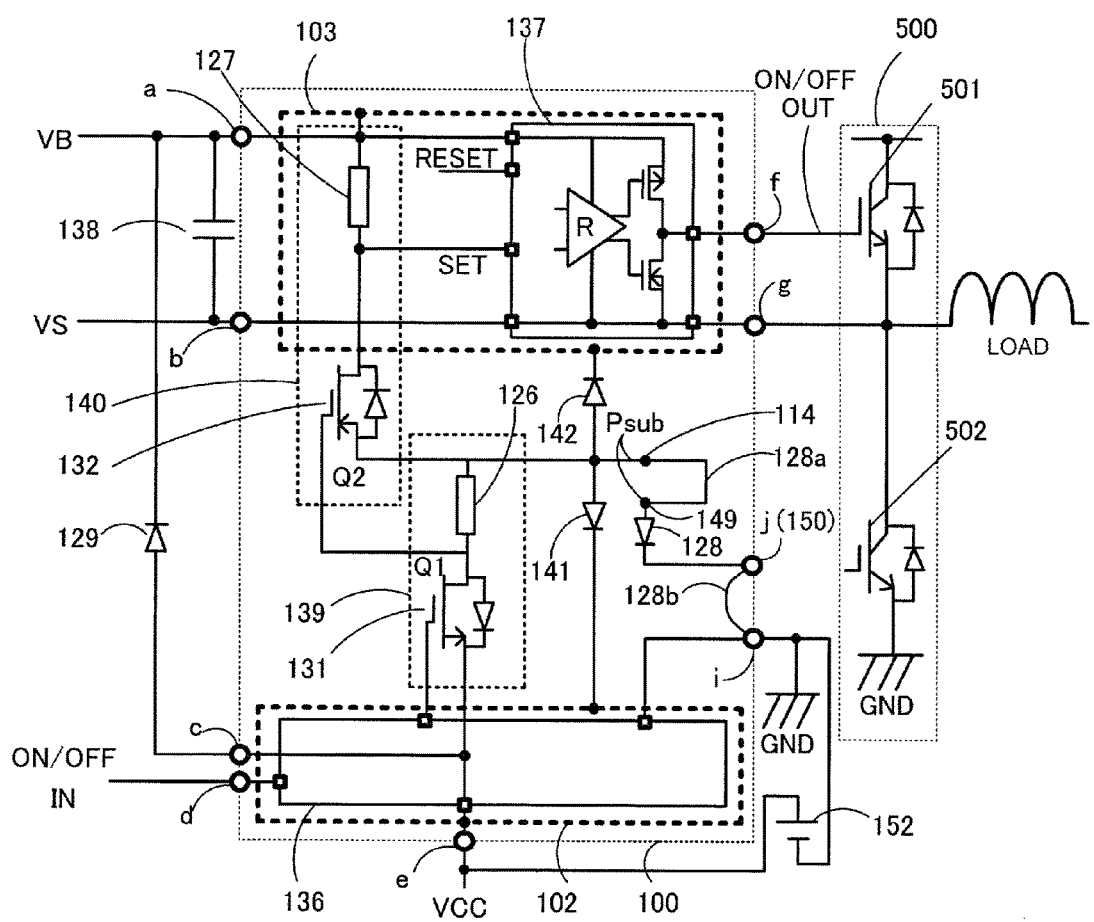
FIG. 4 is a circuit diagram of a driver circuit having the semiconductor device shown in FIG. 1.

The semiconductor device 100 drives a power conversion bridge circuit 500 shown in FIG. 4 that is applied to a power convertor such as an industrial inverter. This power conversion bridge circuit 500 has its high-side and low-side power devices 501 and 502 of voltage control type such as IGBTs connected in series between a power supply line to which a voltage of several hundred V is supplied from a high-voltage power supply, and a ground which is a common potential. A VS potential, an intermediate potential, is supplied to an intermediate point between the high-side power device 501 and the low-side power device 502. The present embodiment describes an example in which the high-side power device 501 of the power conversion bridge circuit 500 is driven. Note that the present embodiment describes a case in which the high-voltage power supply is, for example, a 400-V commercial power supply.

The semiconductor device 100 has an input control circuit 136 that is formed on one side of a p-type bulk substrate (Psub) 101 configuring a semiconductor layer, a first level down circuit 139 including two Pch level shifters 131 (for transmitting a set signal and a reset signal), and a second high voltage junction terminating structure 130a. The bulk substrate is an original substrate on which diffusion regions are not yet formed.

The input control circuit 136 is disposed in a low-side circuit region 133 formed in the front surface side of the p-type bulk substrate 101.

The second high voltage junction terminating structure 130a is formed to surround the low-side circuit region 133 and has an isolation breakdown voltage set at 1200 V to isolate, for example, the p bulk substrate 101 and the low-side circuit region 133 from each other. Because this second high voltage junction terminating structure 130a, a breakdown voltage between the low-side circuit region 133 and the p-type bulk substrate 101 can be kept even when a third potential of the p-type bulk substrate 101 (Psub potential) becomes approximately −1200 V, preventing the low-side circuit region 133 from breaking.

The Pch level shifters 131 are each configured with a first Pch field effect transistor Q1 formed integrally with the second high voltage junction terminating structure 130a, and there are two of these level shifters, i.e., a level shifter for transmitting a set signal and a level shifter for transmitting a reset signal.

The semiconductor device 100 also has a high-side gate driver circuit 137 formed on the other side of the p-type bulk substrate 101, a first level up circuit 140 including two Nch level shifters (for transmitting a set signal and a reset signal), and a first high voltage junction terminating structure 130. The high-side gate driver circuit 137 is disposed in a high-side circuit region 135 formed on the front surface side of the p-type bulk substrate 101. The first high voltage junction terminating structure 130 having a breakdown voltage set at, for example, 1200 V is formed to surround the high-side circuit region 135. Because this first high voltage junction terminating structure 130, a voltage that is higher than the potential of the low-side circuit region 133 by approximately 1200 V can be applied to the high-side circuit region 135.

The Nch level shifters 132 are each configured with a second Nch field effect transistor Q2, described hereinafter, which is formed integrally with the first high voltage junction terminating structure 130, and there are two of these level shifters, i.e., a level shifter for transmitting a set signal and a level shifter for transmitting a reset signal.

In the diagrams, letters HI means "high level," LO means "low level," IN means "input," and OUT means "output." A signal at the IN side is based on a first potential, which is the GND potential, while a signal at the OUT side is based on a second potential, which is the VS potential.

The semiconductor device 100 further has two first diodes 128 that are formed on the front surface side of the p-type bulk substrate 101 in order to isolate a third potential, a floating potential of the p-type bulk substrate 101, from the first potential, the GND potential. The two first diodes 128 are connected in parallel between the first level down circuit 139 and the GND terminal of the input control circuit 136.

Figure 2:
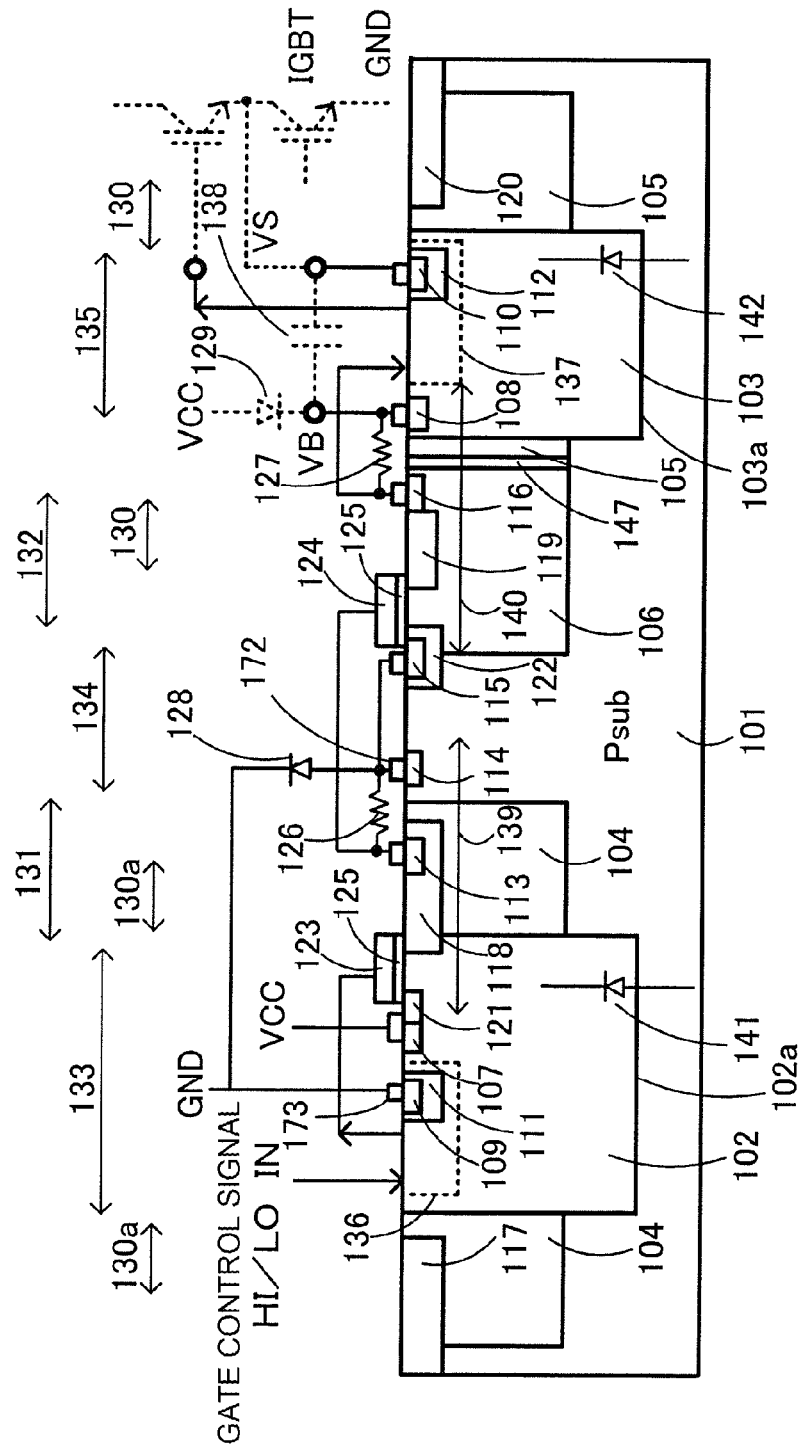
FIG. 2 is a cross-sectional diagram of the substantial parts, taken along line II-II of FIG. 1.

FIG. 2 is a cross-sectional diagram of the substantial parts of the semiconductor device 100 shown in FIG. 1, taken along line II-II.

Specifically, an n diffusion region 102, a first semiconductor region configuring the low-side circuit region 133 in the front surface of the substrate, is formed in the p-type bulk substrate 100 configuring a semiconductor layer. The input control circuit 136 is formed on the front surface side of the n diffusion region 102. The input control circuit 136 is connected to the ground (GND) terminal, the reference potential, by a p$^+$ diffusion region 109 and a p diffusion region 111 configuring a third semiconductor region.

The n diffusion region 102 is also connected to a VCC terminal by an n$^+$ diffusion region 107. A first parasitic diode 141 is formed in a junction 102a between the n diffusion region 102 configuring the first semiconductor region and the p-type bulk substrate 101 configuring a semiconductor layer. Between the VCC terminal and the ground (GND) terminal of the common first potential, which is the reference terminal, a drive voltage for driving the input control circuit 136 is applied from a second low-voltage power supply 152 of approximately 5 V.

The second high voltage junction terminating structure 130a, having a breakdown voltage of, for example, 1200 V which is higher than that of the first high voltage junction terminating structure 130 described hereinafter, is formed around the n diffusion region 102. The second high voltage junction terminating structure 130a is configured by a double-RESURF structure with an n$^-$ diffusion region 104, which is an n-type diffusion region configuring a light fifth semiconductor region, a p diffusion region 117 configuring a shallow p-type diffusion region, a p$^-$ diffusion region 118 configuring a sixth semiconductor region, and the p-type bulk substrate 101.

The Pch level shifters 131 are each a first Pch field effect transistor Q1 formed integrally with the second high voltage junction terminating structure 130a. The components of each Pch level shifter 131 are as follows: the p diffusion region 118 that configures a drain-drift region of the first field effect transistor Q1 configuring each Pch level shifter 131 and is formed across the n$^-$ diffusion region 104 and the n diffusion region 102; a p$^+$ diffusion region 113 configuring the drain of the first field effect transistor and formed in the front surface layer of the p diffusion region 118; and a p$^+$ diffusion region 121 configuring the source of the first field effect transistor and formed in the front surface layer of the n diffusion region 102.

Each Pch level shifter 131 also has the n$^+$ diffusion region 107 that configures a pickup of a back gate and is formed in the front surface layer of the n diffusion region 102 in contact with the p$^+$ diffusion region 121. Each Pch level shifter 131 also has a gate oxide film 125 and a gate electrode 123.

Furthermore, an n diffusion region 103 that configures a second semiconductor region configuring the high-side circuit region 135 on the front surface side is formed in the p-type bulk substrate 101. The high-side gate driver circuit 137 is formed on the front surface side of this n diffusion region 103. This high-side gate driver circuit 137 is connected to a VS terminal, to which the VS potential, the second potential, is applied as a reference potential, via the p$^+$ diffusion region 110 and a p diffusion region 112 configuring a fourth semiconductor region. The n diffusion region 103 is connected to a VB terminal, a power supply terminal of the high-side gate driver circuit 137, via the n$^+$ diffusion region 108, the VB terminal being applied with a VB potential, a fourth potential. A power supply voltage of the high-side gate driver circuit 137 of 9 V to 24 V based on the second potential, the VS potential, is applied from a bootstrap capacitor 138 configuring a first low-voltage source to between the VB terminal and the VS terminal. A second parasitic diode 142 is formed in a junction 103a between the n diffusion region 103 configuring a second semiconductor region and the p-type bulk substrate 101 configuring a semiconductor layer.

The first high voltage junction terminating structure 130 is formed around the high-side circuit region 135, in which a voltage that is higher than the potential of the low-side circuit region 133 by approximately 1200 V can be applied to the high-side circuit region 135. The first high voltage junction terminating structure 130 is configured by a double-RESURF structure with an n⁻ diffusion region 105, which is a light n-type diffusion region, a p diffusion region 120 configuring a shallow p-type diffusion region, and the p-type bulk substrate 101.

The Nch level shifters 132 are each configured with a second Nch field effect transistor Q2 formed integrally with the first high voltage junction terminating structure 130. The components of each Nch level shifter are: an n⁻ diffusion region 106, which is an n-type diffusion region which is a deep, light seventh semiconductor region configuring a breakdown voltage structure and drain-drift region, a p⁻ diffusion region 119 which is a p-type diffusion region configuring a shallow eighth semiconductor region configuring the first high voltage junction terminating structure 130, an n⁺ diffusion region 116 which is a shallow, dark n-type diffusion region configuring the drain, an n⁺ diffusion region 115 which is a shallow, dark n-type diffusion region configuring the source, a p diffusion region 122 which is a relatively shallow and dark p-type diffusion region configuring the channel, a p⁺ diffusion region 114 which is a shallow, dark p-type diffusion region configuring the pickup of the back gate, a gate oxide film 125, and a gate electrode 124.

The p-type bulk substrate 101 is connected to the anode of the first diode 128 for blocking surge current via the p⁺ diffusion region 114 and an anode electrode 172 that are formed on the front surface side of the p-type bulk substrate 101, and the cathode of this first diode 128 is connected to the ground (GND) terminal.

Figure 3:
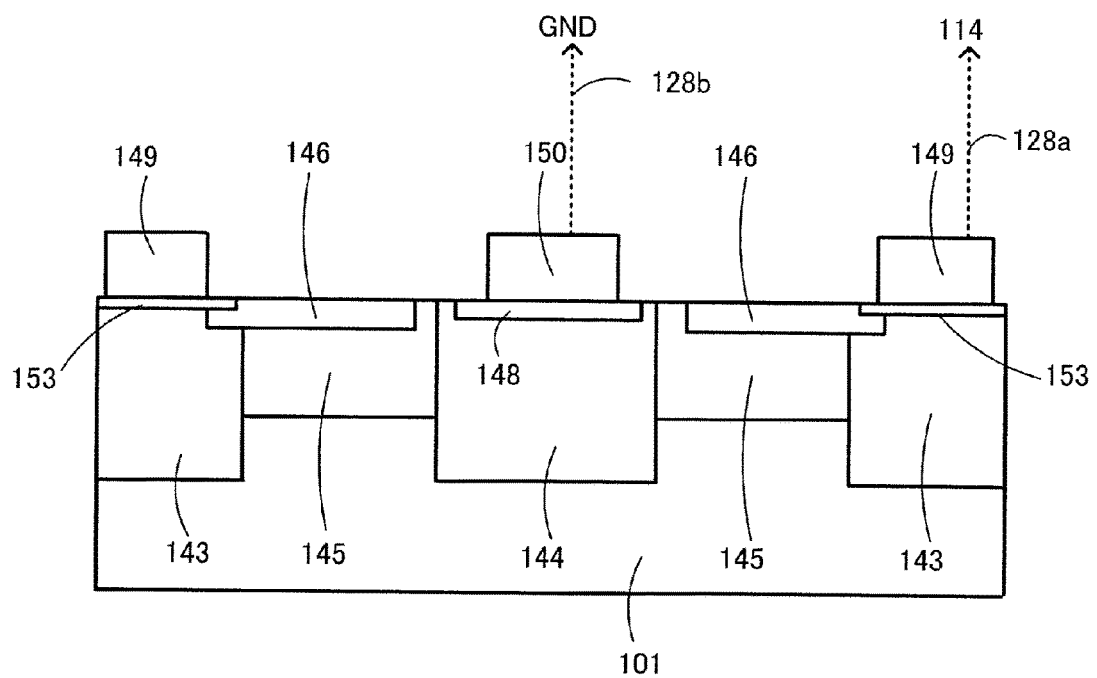
FIG. 3 is a cross-sectional diagram showing substantial parts of a first diode.

FIG. 3 is a cross-sectional diagram showing substantial parts of the first diode 128. The first diode 128 is a lateral high voltage diode embedded in the p-type bulk substrate 101 and having a breakdown voltage of approximately 1200 V. The breakdown voltage structure is a double-RESURF structure configured with the p-type bulk substrate 101, an n⁻ diffusion region 145 formed in the front surface layer of the p-type bulk substrate 101, and a p diffusion region 146 formed in the front surface layer of the n⁻ diffusion region 145. The components of the cathode of the first diode 128 include the n⁻ diffusion region 145 that configures a drift region, is formed in the front surface layer of the p-type bulk substrate 101, and surrounds an n diffusion region 144, and the n diffusion region 144 that lowers the dynamic resistance and is formed in the front surface layer of the p-type bulk substrate 101. The components also include an n⁺ diffusion region 148 formed in the front surface layer of the n diffusion region 144 and a cathode electrode 150 for the purpose of establishing a contact. The components of the anode include the p⁻ diffusion region 146 configuring the double-RESURF structure and a p diffusion region 143 for lowering the dynamic resistance. The components also include a p⁺ diffusion region 153 and anode electrode 149 for the purpose of establishing a contact. Although not shown, the planar shape of the first diode 128 is such that the components of the anode surround the components of the cathode. The anode electrode 149 is connected to the anode electrode 172 of FIG. 2 by a metal line 128a formed on an interlayer insulator, and the cathode electrode 150 (shared with a cathode terminal j) is connected to a cathode electrode 173, the GND terminal, by a bonding wire 128b. The bonding wire 128b cuts across on the p⁺ diffusion region 153 but is capable of securing breakdown voltage of the first diode 128 by keeping a sufficient distance between the p⁺ diffusion region 153 and the bonding wire 128b.

By forming the first diode 128 in the front surface layer of the p-type bulk substrate 101 in this manner, the double-RESURF structure can be employed and high breakdown voltage can be achieved. In addition, because the diodes do not have to be provided externally as described above, the semiconductor device of the present invention can be made smaller than a semiconductor device with external diodes, thereby realizing cost reduction.

It should be noted that two first diodes 128 are formed as shown in FIG. 1. Such a configuration aims to reduce the on-resistance by connecting the first diodes 128 in parallel. This is because there is a possibility that malfunctions occur in the input control circuit 136 and the high-side gate driver circuit 137 when the psub potential of the p-type bulk substrate 101 is increased by the on-resistance of the first diodes 128 when a displacement current is generated due to a so-called dV/dt surge where the VS potential increases drastically. It goes without saying that a single diode with a low on-resistance may be provided.

FIG. 4 is a circuit diagram showing a driver circuit having the semiconductor device 100 according to the present invention. In this diagram, the alphabet "a" represents the VB terminal to which a high-potential side terminal of the bootstrap capacitor 138 is connected, "b" the VS terminal to which a low-potential side terminal of the bootstrap capacitor 138 is connected, "c" a connecting terminal connected to the anode of a bootstrap diode 129, "d" an input terminal for ON/OFF signals, "e" the VCC terminal, "f" an output terminal for ON/OFF signals, "g" the VS terminal connected to the intermediate potential point of the power conversion bridge circuit 500, "j" the cathode terminal, and "I" the GND terminal. These terminals correspond to the terminals of the semiconductor device 100. The small black circles represent the connecting points of the circuits, and the small squares represent the connections to the respective circuit regions.

The VB terminal a and the VS terminal b are connected to the input terminal of the high-side gate driver circuit 137 by power supply lines, and the output terminal of the high-side gate driver circuit 137 is connected to the output terminal f and the VS terminal g. The bootstrap capacitor 138 is a first low-voltage source that has the second potential, the VS potential, as a reference potential, and is charged to the fourth potential, the VB potential, which is higher than the second potential by 9 to 24 V.

Furthermore, the input terminal d is connected to the input terminal of the input control circuit 136, and the VCC terminal e is connected to the power supply terminal of the input control circuit 136 and to the connecting terminal c. A first gate control signal is output from the input control circuit 136 and input to the first level down circuit 139, and a second gate control signal is output from the first level down circuit 139 and input to the first level up circuit 140. A third gate control signal is output from the first level up circuit 140 and input to the set terminal of the high-side gate driver circuit 137.

The first level down circuit 139 is configured by a series circuit of a first level shift resistor 126 and the first field effect transistor Q1 configuring each Pch level shifter 131. The first level up circuit 140 is similarly configured with a series circuit of a second level shift resistor 127 and the second field effect transistor Q2 configuring each Nch level shifter 132. The first level down circuit 139 receives the first gate control signal that is output from the input control circuit 136 to the gate of the first field effect transistor Q1, and the second gate control signal that is output from an intermediate point between the first level shift resistor 126 and the first field effect transistor Q1 is input to the gate of the second field effect transistor Q2 configuring each Nch level shifter 132 of the first level up circuit 140. The terminal of the first level shift resistor 126 on the side opposite to the first field effect transistor Q1 is connected to the source of the second field effect transistor Q2 of the first level up circuit 140 and to the connecting point between the first parasitic diode 141 and the second parasitic diode 142.

Moreover, the terminal of the second level shift resistor 127 of the first level up circuit 140 on the side opposite to the second field effect transistor Q2 is connected to the VB terminal a, and the third gate control signal that is output from the connecting point between the second level shift resistor 127 and the second field effect transistor Q2 is input to the set terminal of the high-side gate driver circuit 137.

Furthermore, the anode electrode 149 of the first diode 128 is connected to the Psub terminal h by the metal line 128a, and the Psub terminal h is connected to the connecting point between the first parasitic diode 141 and the second parasitic diode 142. The cathode electrode 150 (=cathode terminal j) of the first diode 128 is connected to the ground (GND) terminal i by the bonding wire 128b.

The first level down circuit 139 is provided between the input control circuit 136 and the first level up circuit 140, as described above. By providing the first level down circuit 139 in this manner, a normal signal can be transmitted from the input control circuit 136 to the gate of the second field effect transistor Q2 configuring each Nch level shifter 132 via the first field effect transistor Q1 configuring each Pch level shifter 131, even when a negative voltage surge is applied to the p-type bulk substrate 101 through the VS terminal or at the time of the normal operation in which a negative voltage surge is not applied.

Although not shown, the first level shift resistor 126 of the first level down circuit 139 can be replaced with a diode having an anode at the Psub side. Also, a first level shift circuit is configured with the first level up circuit 140 and the first level down circuit 139.

Additionally, the first diode 128 having its cathode at the GND side is provided between the Psub terminal h, the terminal of the p-type bulk substrate 101, and the GND terminal i. Providing this first diode 128 in this manner can make the impedance between the p-type bulk substrate 101 and the GND at least 10 times higher than the impedance of the parasitic diode 142 when a negative voltage surge is applied to the VS terminal g. Such a configuration can block a negative surge current that flows to the n diffusion region 103 through the surge current path extending from the GND terminal i and passing through the second parasitic diode 142. Blocking such a negative surge current can prevent a malfunction of the high-side gate driver circuit 137.

Flows of the gate control signals are described next with reference to FIGS. 2 and 4. A GND potential-based gate control signal is input from a microcomputer or the like to the input control circuit 136 that is operated based on the GND potential. The GND potential-based gate control signal that is output from the input control circuit 136 is input to the gate of the first field effect transistor Q1 configuring the Pch level shifter 131 of the first level down circuit 139, and is then converted into a gate control signal based on the Psub potential, a floating potential of the p-type bulk substrate 101. The gate control signal having the Psub potential as a reference potential is then input to the gate of the second field effect transistor Q2 configuring the Nch level shifter 132 of the first level up circuit 140, and is converted into a gate control signal based on the second potential, the VS potential. The second potential-based gate control signal is transmitted to the high-side gate driver circuit 137. The high-side gate driver circuit 137 outputs a gate control signal for driving the external high-side power device (IGBT) 501.

The two Pch level shifters 131 shown in FIG. 1 are a setting level shifter for turning the gate control signals on and a resetting level shifter for turning the gate controls signal off, and are operated only when the levels of the gate control signals change.

Therefore, the power consumption of the level shifters can be reduced more than when only one level shifter is used. Much the same is true of the operations of the two Nch level shifters 132. Note that FIG. 4 only shows the setting Pch level shifter 131 and the setting Nch level shifter 132.

Substrate resistances are described next, as well as concentrations Na and diffusion depths Xj of the primary diffusion regions. The p-type bulk substrate 101 has a specific resistance of 300 Ωcm to 500 Ωcm. The n diffusion region 102 configuring the first semiconductor region, the n diffusion region 103 configuring the second semiconductor region, and the n diffusion region 144 each have Na of $4\times10^{16}/cm^3$ and Xj of 12 μm. The n⁻ diffusion region 104 configuring the fifth semiconductor region, the n⁻ diffusion region 105, the n⁻ diffusion region 106 configuring the seventh semiconductor region, and the n⁻ diffusion region 145 each have Na of $7\times10^{15}/cm^3$ and Xj of 10 μm. The p⁻ diffusion region 117, the p diffusion region 118 configuring the sixth semiconductor region, the p⁻ diffusion region 119 configuring the eighth semiconductor region, the p⁻ diffusion region 120, and the p⁻ diffusion region 146 each have Na of $6\times10^{15}/cm^3$ and Xj of 2 μm. The p⁻ diffusion region 147 has Na of $4\times10^{15}/cm^3$ and Xj of 10 μm. The width of the high voltage junction terminating structure is approximately 200 μm.

Reactions that occur when a negative voltage surge is generated are described next with reference to FIGS. 2 and 4. When the second potential which is the VS potential and the fourth potential which is the VB potential drop below the first potential which is a GND potential by, for example, 200 V due to application of a negative voltage surge, the second parasitic diode 142 is biased forward, as in the conventional HVIC 200, resulting in the ON state. The first diode 128, on the other hand, enters the OFF state at the time of the occurrence of a negative voltage surge, due to a reverse bias. Because the path passing through the OFF first diode 128 is formed only between the GND terminal i and the second parasitic diode 142, no current flows to the second parasitic diode 142 even when a negative voltage surge is generated. For this reason, a potential difference equal to or greater than 0.6 V, which is a forward voltage of the second parasitic diode 142, is not generated between the p-type bulk substrate 101 configuring the second parasitic diode 142 and the VB terminal a. When a negative voltage surge is generated, the third potential which is the Psub potential conforms with the second potential which is the VS potential and the fourth potential which is the VB potential, with constant potential differences therewith, and becomes lower than the first potential. Since the low-side circuit region 133 is surrounded by the second high voltage junction terminating structure 130a having a breakdown voltage of approximately 1200 V, the breakdown voltage between the low-side circuit region 133 and the p-type bulk substrate 101 is kept, even when the third potential becomes lower than the first potential by approximately 1200 V, thereby enabling a normal operation of the input control circuit 136 based on the first potential. In addition, even when the third potential is reduced to below the first potential by approximately 1200 V by the Pch level shifter 131 having a breakdown voltage of approximately 1200 V, the gate control signals are transmitted normally to the Nch level shifter 132.

With the foregoing operations, up to a negative voltage surge of approximately 1200 V, the semiconductor device 100 of the first embodiment can normally be operated without causing a malfunction of the high-side gate driver circuit 137.

The first embodiment can prevent the occurrence of a potential difference equal to or greater than 0.6 V, which is the forward voltage of the second parasitic diode 142, between the third potential and the fourth potential, even when a negative voltage surge is generated. Consequently, a surge current that flows from the surge current path passing through the second parasitic diode 142 to the high-side gate driver circuit 137 can be suppressed. This effect can prevent a malfunction of the high-side gate driver circuit that could occur due to a negative voltage surge.

In this semiconductor device 100, the third potential is fixed between the first potential and the forward voltage of the first diode 128+0.6 V through the added first diode 128, enabling the normal operation of the semiconductor device 100 at all times.

Moreover, the semiconductor device 100 can accomplish cost reduction because such negative voltage power supplies as those of Patent Literatures 2 and 3 are not required. Furthermore, cost reduction can be expected by the use of the self-isolation type process in place of the dielectric isolation type or junction isolation type process.

Note that a method for connecting current mirror circuits between the drain of the Pch level shifter 131 ($p^+$ diffusion region 113) and the first level shift resistor 126 and between the drain of the Nch level shifter 132 ($n^-$ diffusion region 116) and the second level shift resistor 127 to let currents flow to the first level shift resistor 126 and the second level shift resistor 127, and a method for connecting the bases of pnp transistors or npn transistors to the drains to let currents flow to the first level shift resistor 126 and the second level shift resistors 127 through the transistors, can be used as the first level down circuit 139 and the first level up circuit 140.

A modification in which the semiconductor device 100 is configured into a junction isolation type is described next with reference to FIG. 5.

Figure 5:
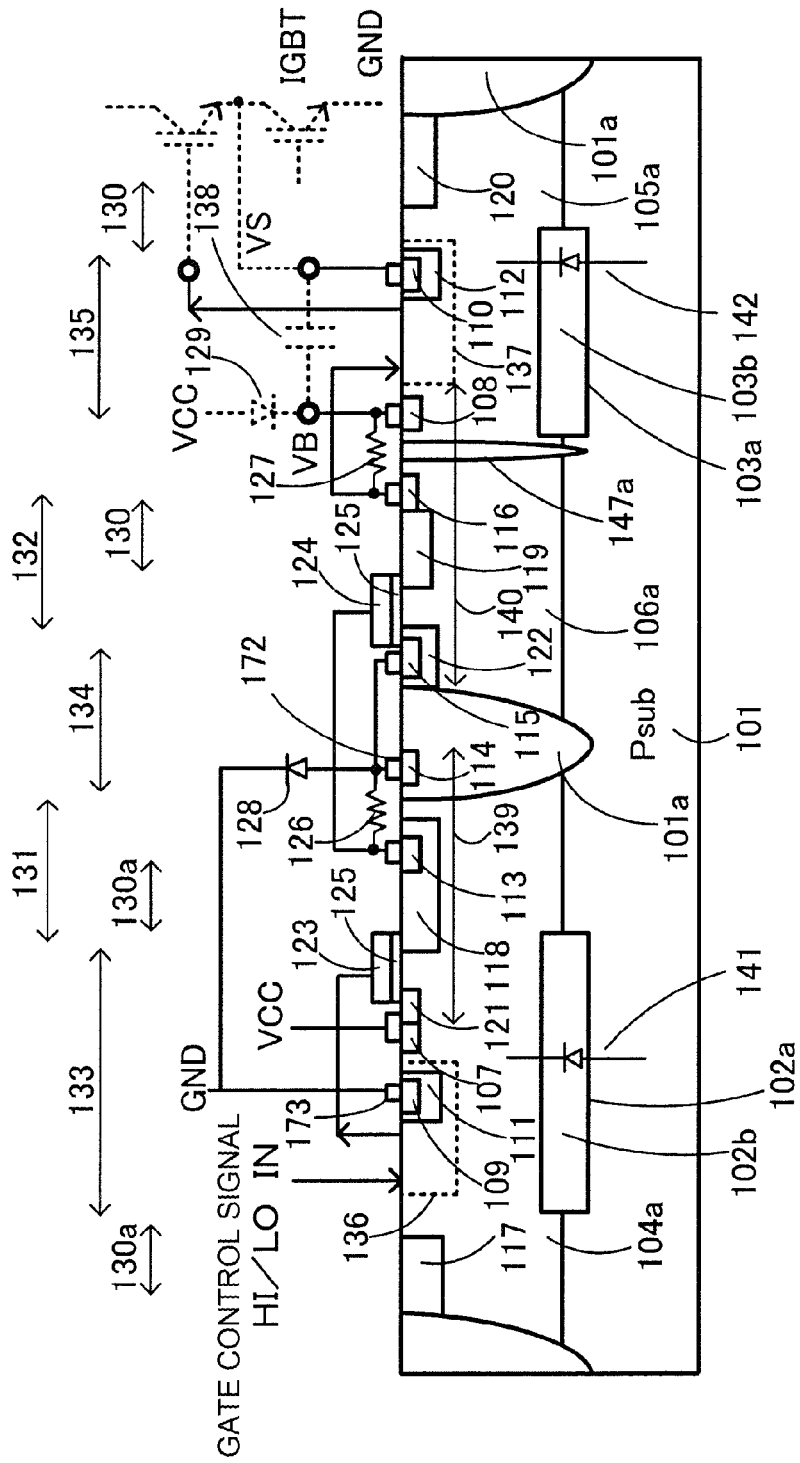
FIG. 5 is a cross-sectional diagram of the substantial parts that is taken along line II-II of FIG. 1 to illustrate a modification of the first embodiment.

FIG. 5 is a cross-sectional diagram of the substantial parts, taken along line II-II of FIG. 1.

FIG. 5 shows an example of the junction isolation. Unlike the example of the self isolation type shown in FIG. 2, $n^-$ epitaxial growth layers 104a, 105a, 106a are formed by epitaxial growth on the p-type bulk substrate 101. A buried region 102b is disposed between the n- epitaxial growth layer 104a and the p-type bulk substrate 101 under the low-side circuit region 133. A buried region 103b is disposed between the epitaxial growth layer 105a and the p-type bulk substrate 101 under the high-side circuit region 135.

The epitaxial growth layer 104a is separated from the epitaxial growth layer 105a and the epitaxial growth layer 106a by a p diffusion isolation region 101a, a diffusion region. The $p^+$ diffusion region 114 is formed in the front surface layer of the p diffusion isolation region 101a. The rest of the configuration is the same as that shown in FIG. 2.

Figure 6:
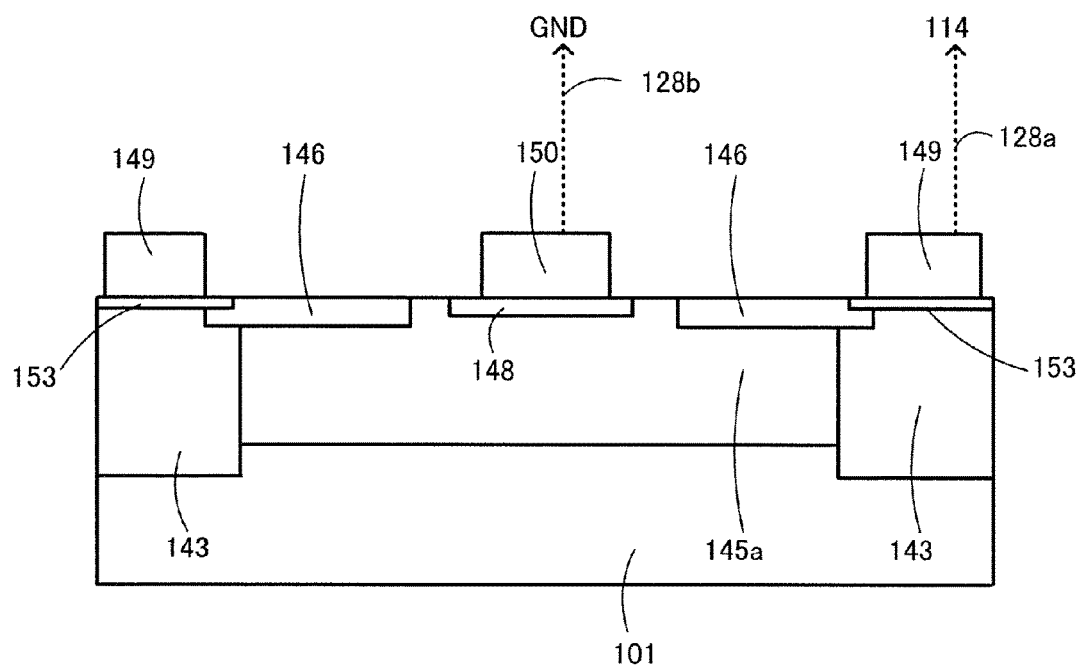
FIG. 6 is a cross-sectional diagram showing the substantial parts of the first diode.

FIG. 6 is a cross-sectional diagram showing substantial parts of the first diode 128.

FIG. 6 shows an example of the junction isolation type, illustrating the first diode 128 integrated in the semiconductor substrate shown in FIG. 5. Unlike the example of self isolation type shown in FIG. 3, an $n^-$ epitaxial growth layer 145a is formed by epitaxial growth on the p-type bulk substrate 101. The rest of the configuration is the same as that shown in FIG. 3.

The same effects as those of the first embodiment can be accomplished even in the junction isolation type.

Second Embodiment

A second embodiment, an example of the present invention, is described next with reference to FIGS. 7 and 8.

Figure 7:
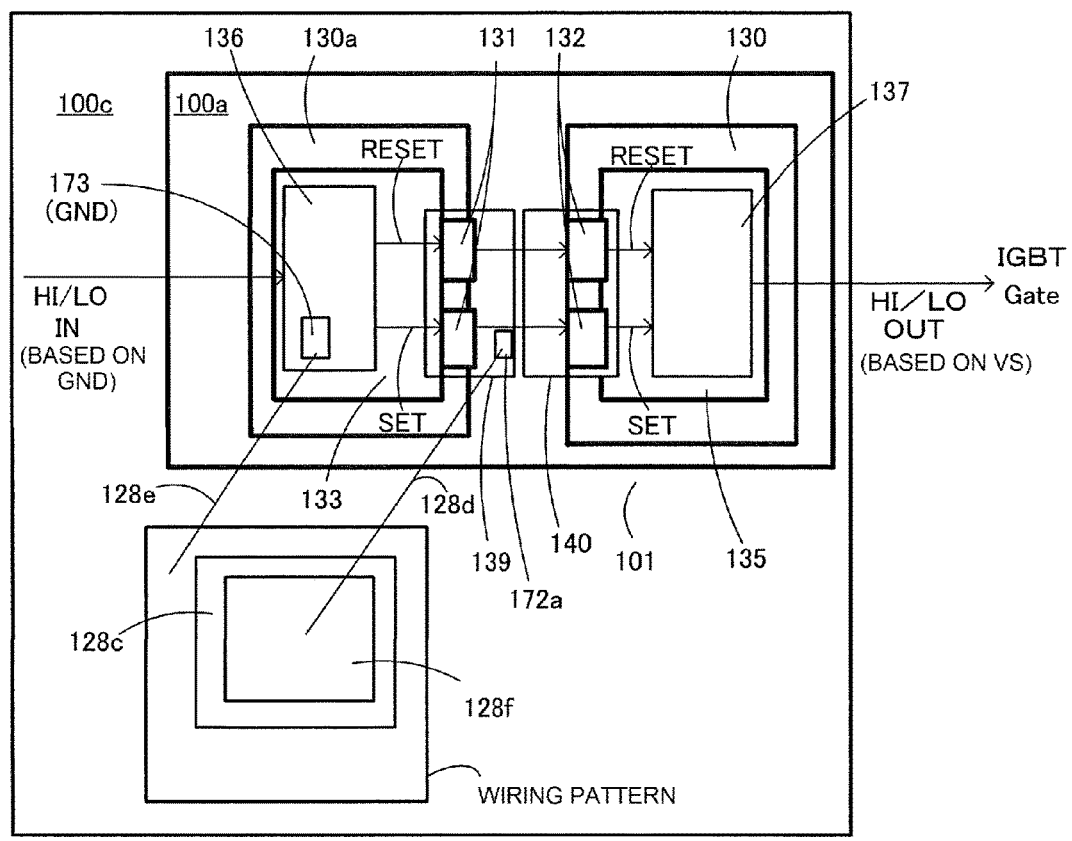
FIG. 7 is a plan view showing substantial parts of a semiconductor device according to a second embodiment of the present invention.
Figure 8:
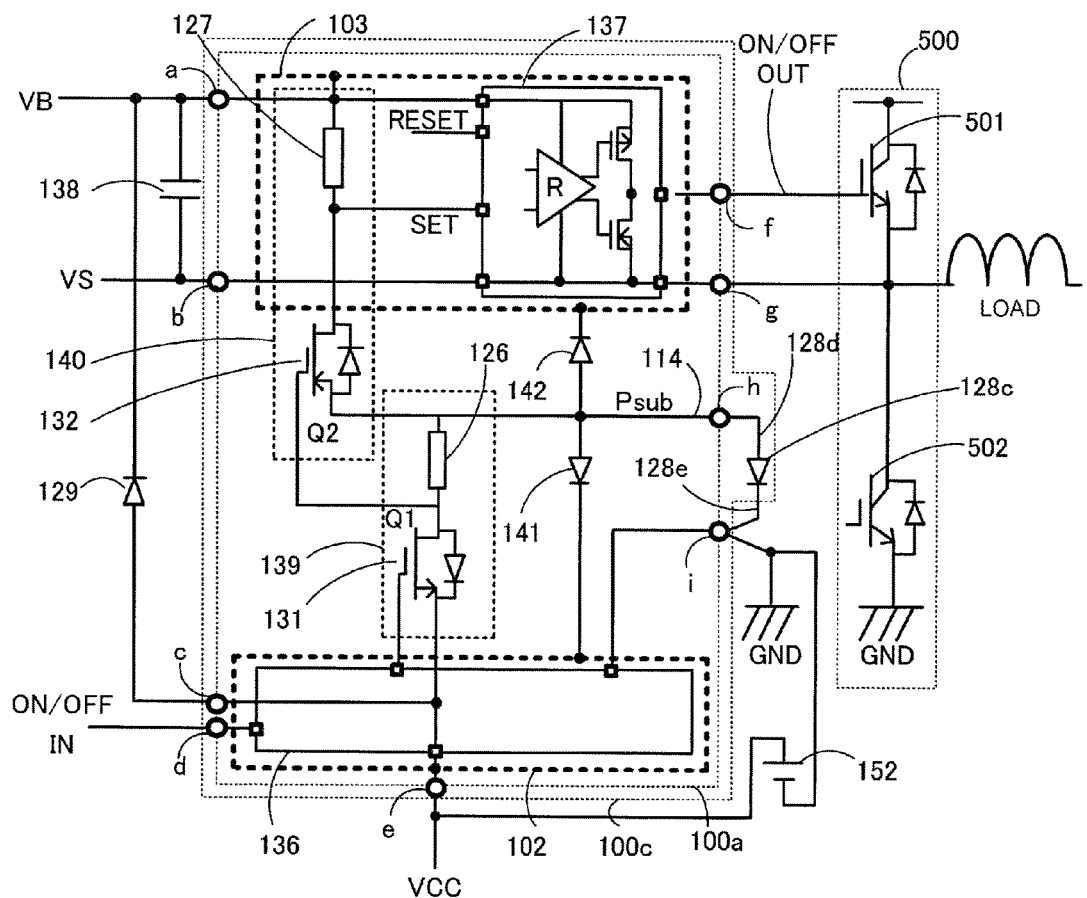
FIG. 8 is a circuit diagram of a driver circuit having the semiconductor device according to the second embodiment of the present invention.

FIG. 7 is a plan view showing substantial parts of a semiconductor device 100a and semiconductor device 100c according to the present invention. FIG. 8 is a circuit diagram showing a driver circuit having the semiconductor device 100a and semiconductor device 100c according to the present invention.

The semiconductor device 100a is the same as the semiconductor device 100, except that the semiconductor device 100a does not have the first diode 128 of the semiconductor device 100 shown in FIGS. 1 to 4. In place of the first diode 128 in the p-type bulk substrate 101, an external third diode 128c is attached to the semiconductor device 100a to construct the semiconductor device 100c.

The third diode 128c has an anode connected to the Psub terminal h and a cathode connected to the GND terminal i. The cathode of the third diode 128c can also be connected directly to the reference potential (ground (GND) potential).

A high voltage diode can be used as the third diode 128c, and a high voltage diode chip that passes a current between two primary surfaces of the semiconductor substrate is preferably used. When the high voltage diode chip is used, the third diode 128c is disposed on a wiring pattern 171 in such a manner that the wiring pattern 171 and the cathode electrode (not shown) on the rear surface of the third diode 128c are joined to each other, as shown in FIG. 7.

The electrode connected to the $p^-$ diffusion region 114 in FIG. 2 is taken as an anode electrode 172a, and this anode electrode 172a and an anode electrode 128f of the high voltage diode chip are connected to each other by a bonding wire 128d. Moreover, the GND terminal connected to the p+ diffusion region 109 in FIG. 2 is taken as the cathode electrode 173, and this cathode electrode 173 and the wiring pattern 171 are connected to each other by a bonding wire 128e. The cathode electrode of the high voltage diode chip can be connected separately to the ground (GND) instead of being connected to a GND pad electrode of the semiconductor device 100a.

The second embodiment can accomplish the same effects as those of the first embodiment.

Third Embodiment

A third embodiment, an example of the present invention, is described next with reference to FIG. 9.

Figure 9:
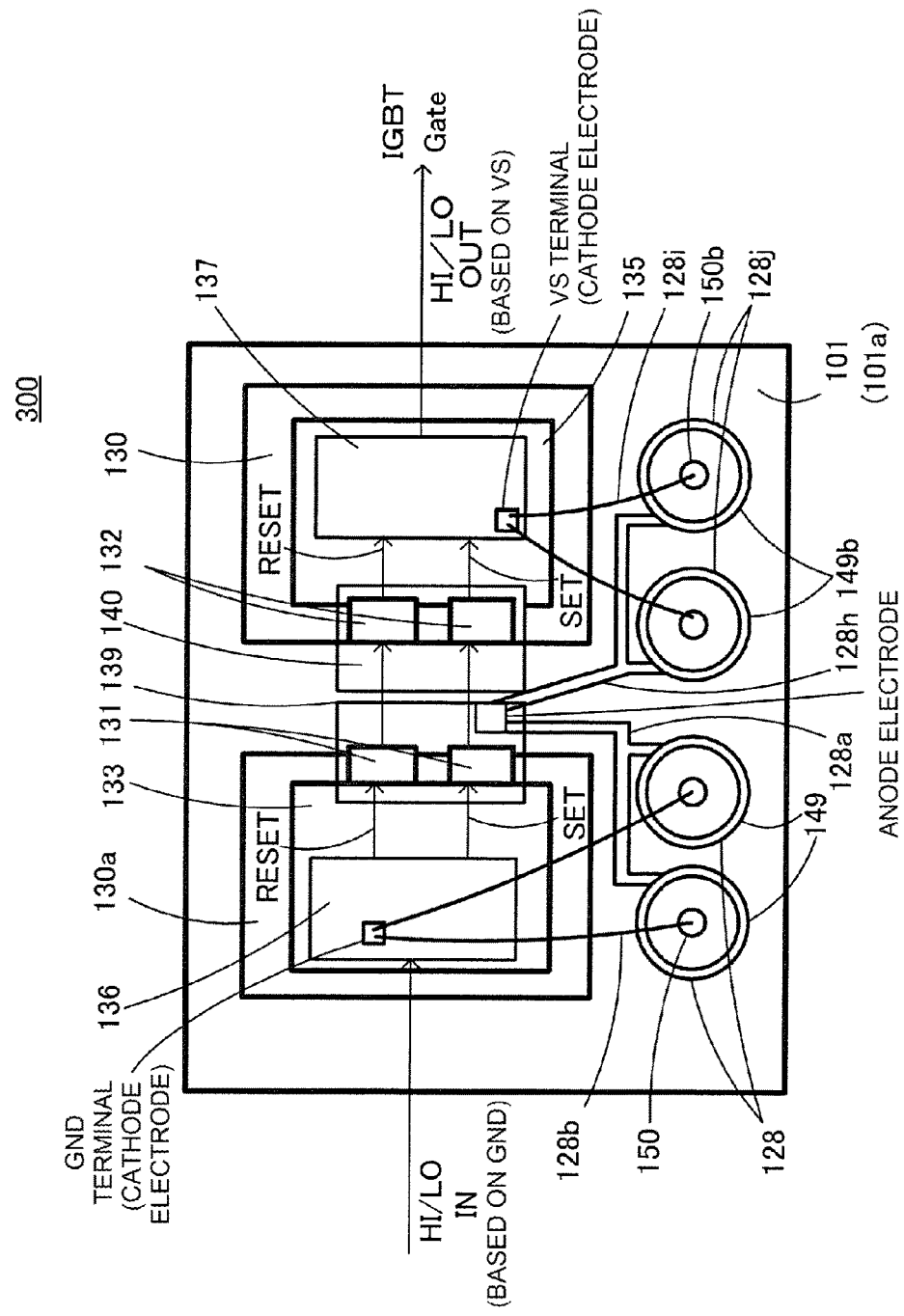
FIG. 9 is a plan view showing substantial parts of a semiconductor device according to a third embodiment of the present invention.

FIG. 9 is a plan view showing substantial parts of a semiconductor device 300 according to the present invention. As with the semiconductor device 100 described in the first embodiment, the semiconductor device 300 has the high-side gate driver circuit 137, first level up circuit 140 including two Nch level shifters 132 (for transmitting a set signal and a reset signal), input control circuit 136, first high voltage junction terminating structure 130, and first diode 128. The difference with the semiconductor device 100 according to the first embodiment is that the semiconductor device 300 has, in addition to the first diode 128, a second diode 128j of the same structure as the first diode 128.

An anode electrode 149b of the second diode 128j is connected to the anode electrode 172 by a metal line 128h, and a cathode electrode 150b of the second diode 128j is connected to the VS terminal g (cathode electrode) by a bonding wire 128i.

Figure 10:
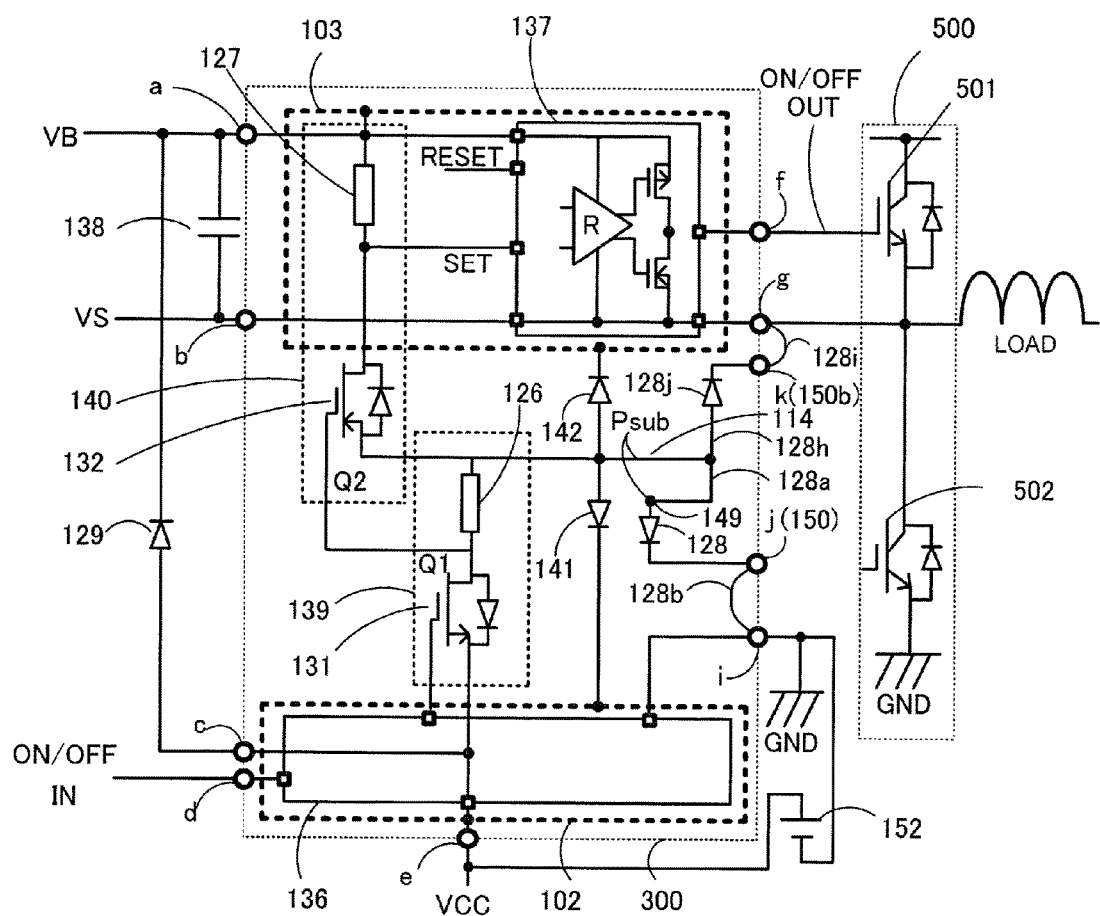
FIG. 10 is a circuit diagram of a driver circuit having the semiconductor device according to the third embodiment of the present invention.
Figure 11:
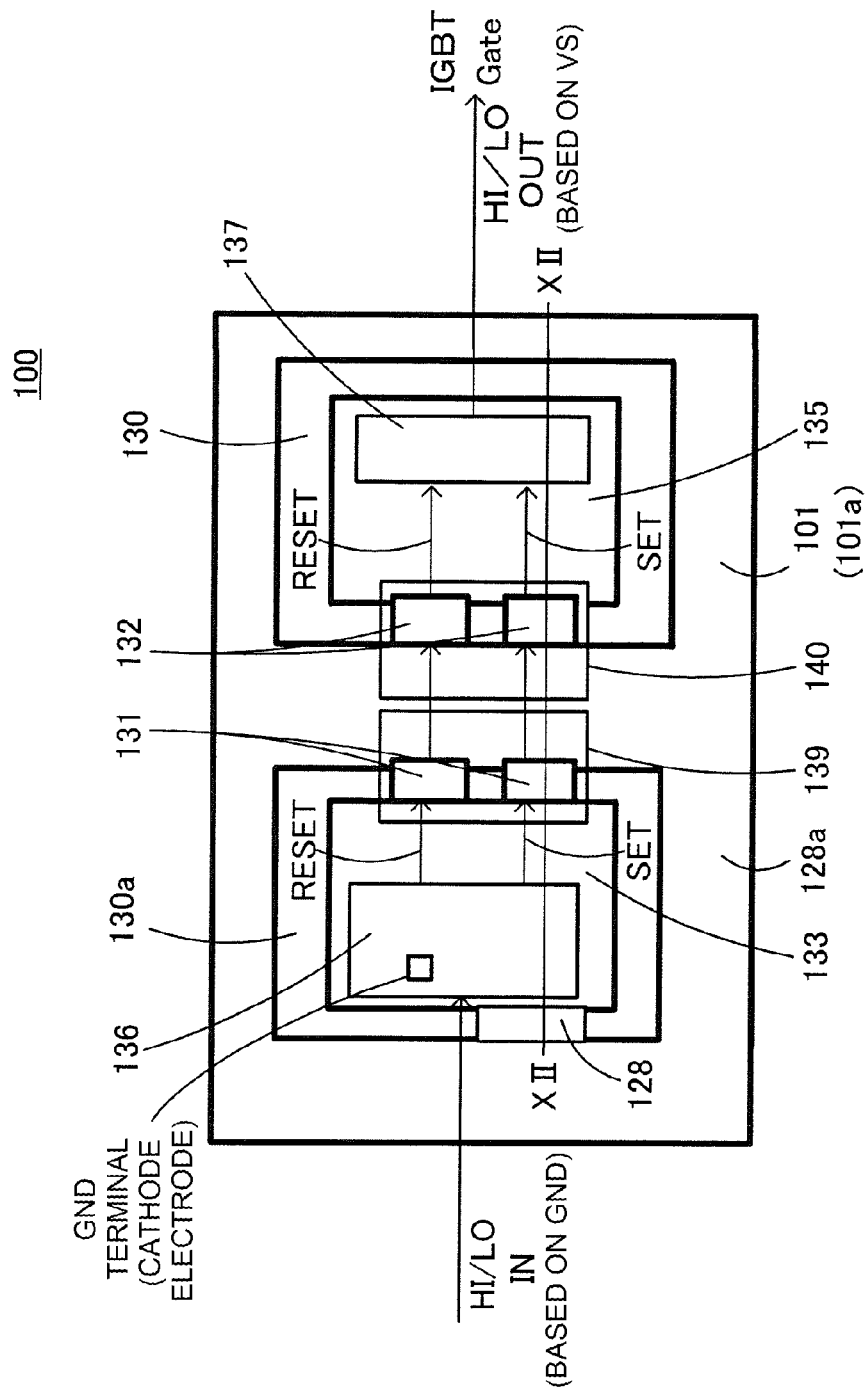
FIG. 11 is a plan view showing substantial parts of a semiconductor device according to a fourth embodiment of the present invention.

FIG. 10 is a circuit diagram showing a driver circuit having the semiconductor device 300 according to the third embodiment. In this diagram, the alphabet "k" represents a cathode terminal (the cathode electrode 159b).

The semiconductor device 100 illustrated in the first embodiment is capable of suppressing a surge current when a negative voltage surge occurs and hence preventing a malfunction of the high-side gate driver circuit 137. However, because the first level up circuit 140 does not operate normally during a period in which the fourth potential, the VB potential, is lower than the third potential which is the Psub potential, the gate control signals cannot be transmitted to the high-side gate driver circuit 137.

The semiconductor device 300 according to the third embodiment, on the other hand, is capable of causing the second diode 128j to prevent the fourth potential, the VB potential, from dropping below the third potential which is the Psub potential. Therefore, the first level up circuit 140 can be operated normally even when a negative voltage surge occurs, enabling transmission of the gate control signals to the high-side gate driver circuit 137. Therefore, the semiconductor device 300 can not only prevent a malfunction of the high-side gate driver circuit 137 but also normally transmit the gate control signals from the microcomputer and the like to the power devices such as the IGBTs even when a negative voltage surge is generated.

Note that FIG. 9 shows two of the second diodes 128j. This is so as to reduce the on-resistance of the second diodes 128j by connecting the two second diodes 128j in parallel. It goes without saying that a single diode with a low on-resistance may be provided.

Fourth Embodiment

A fourth embodiment of the present invention is described next with reference to FIGS. 11 to 14.

The fourth embodiment has the same configuration as the first embodiment, except that the position of each first diode 128 according to the first embodiment described above is different in the fourth embodiment.

In the fourth embodiment, the first diodes 128 is formed integrally with the second high voltage junction terminating structure 130a that surrounds the low-side circuit region 133.

Specifically, the first diode 128 is formed in the p⁻ diffusion region 117 located on the side opposite to the first level down circuit 139 of the second high voltage junction terminating structure 130a, with the low-side circuit region 133 therebetween.

Figure 13:
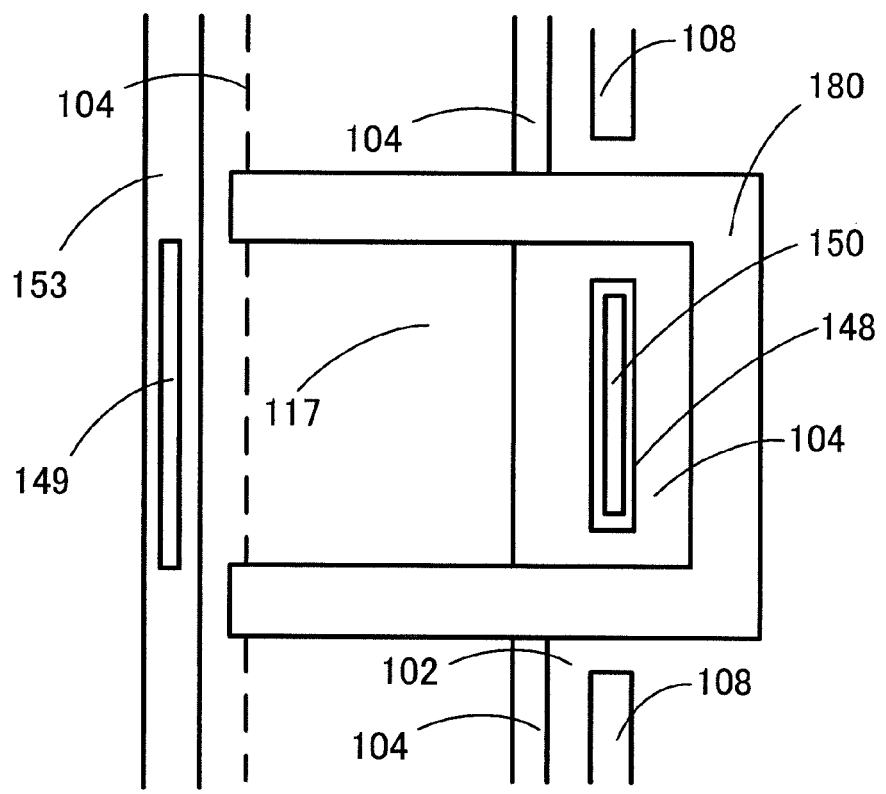
FIG. 13 is a plan view showing the substantial parts of a third diode.

FIG. 13 is a plan view showing substantial parts of the first diode 128. The first diode 128 is a lateral high voltage diode having a breakdown voltage of approximately 1200 V and is integrated with the second high voltage junction terminating structure 130a. The breakdown voltage structure is a double-RESURF structure configured with the p-type bulk substrate 101, the n⁻ diffusion region 104 formed in the front surface layer of the p-type bulk substrate 101 to configure the fifth semiconductor region, and the p diffusion region 117 formed in the front surface layer of the n⁻ diffusion region 104.

The components of the cathode of the first diode 128 include the n⁻ diffusion region 104 that configures a drift region and is formed in the front surface of the p-type bulk substrate 101. The components also include the n⁺ diffusion region 148 formed in the front surface layer of the n⁻ diffusion region 104 and the cathode electrode 150 for the purpose of establishing a contact. The components of the anode include the p⁻ diffusion region 117 configuring the double-RESURF structure, and the p⁺ diffusion region 153 and anode electrode 149 for the purpose of establishing a contact.

The n⁻ diffusion region 104 configuring the cathode of the first diode 128 is electrically isolated from the n⁻ diffusion region 104 configuring the second high voltage junction terminating structure 130a by a p diffusion region 180. This isolation prevents leakage of current between the first diode 128 and the second high voltage junction terminating structure 130a.

Figure 12:
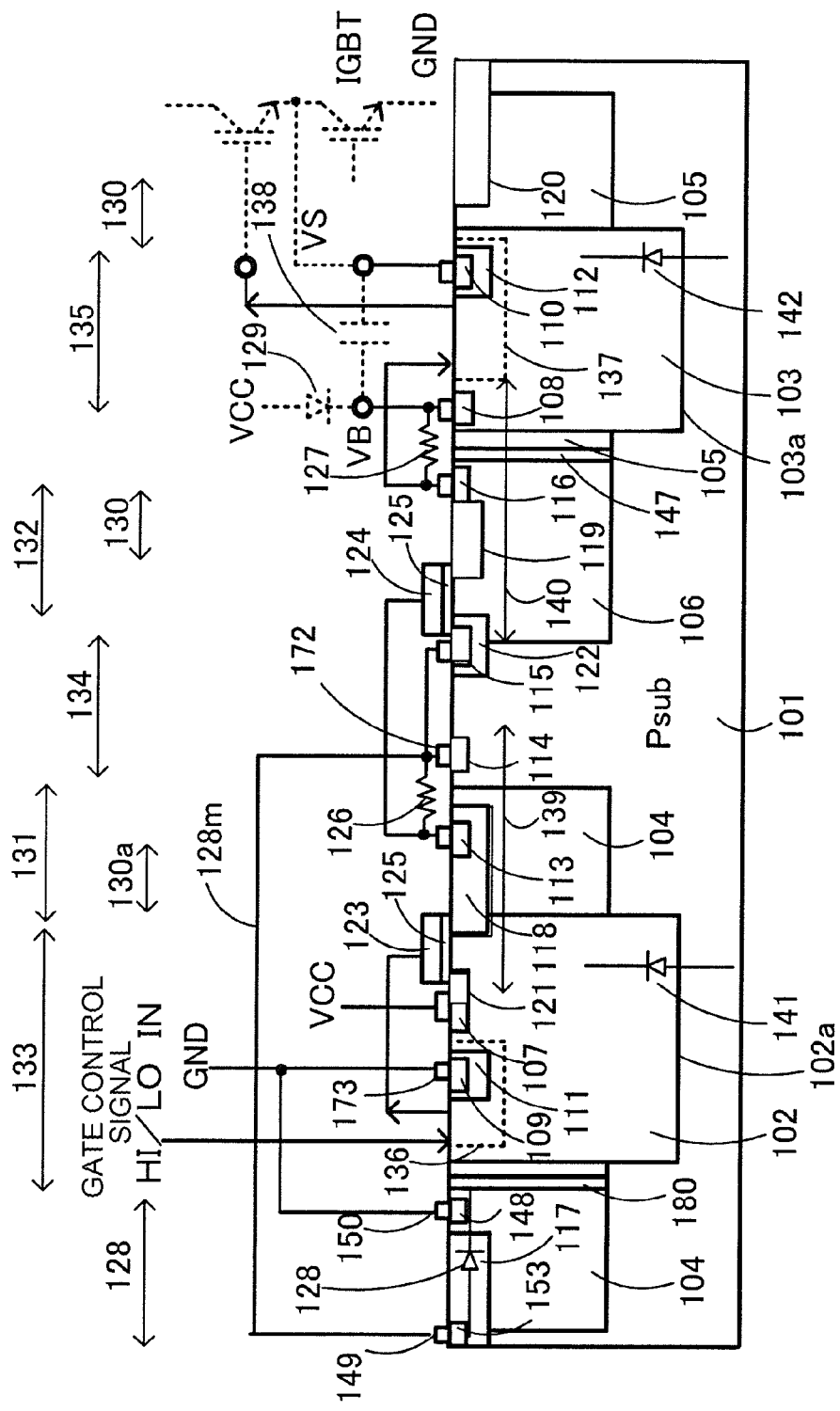
FIG. 12 is a cross-sectional diagram of the substantial parts, taken along line XII-XII of FIG. 11.

The anode electrode 149 is connected to the anode electrode 172 shown in FIG. 12 by a metal line 128m formed on an interlayer insulator, and similarly the cathode electrode 150 is connected to the cathode electrode 173.

Integrating the first diode 128 with the second high voltage junction terminating structure 130a can realize size reduction as opposed to forming the first diode 128 independently from the second high voltage junction terminating structure 130a, and hence cost reduction.

Figure 14:
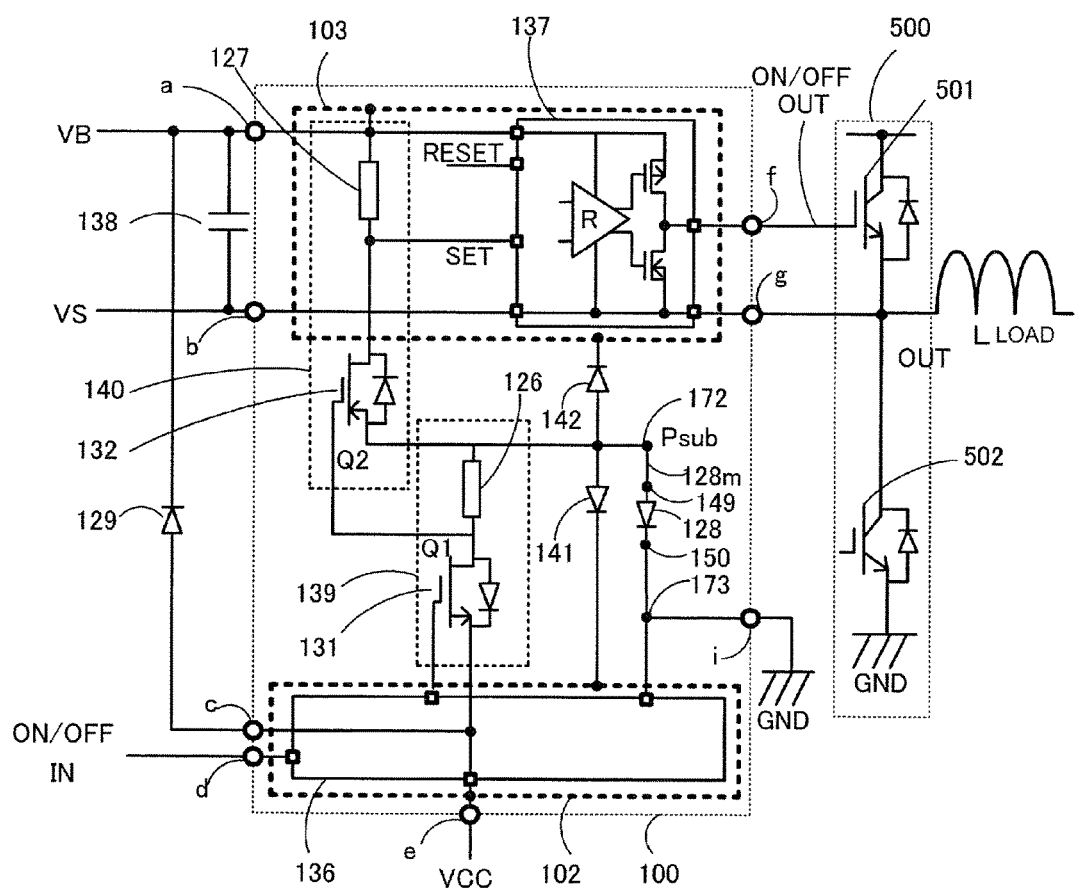
FIG. 14 is a circuit diagram of a driver circuit having the semiconductor device according to the fourth embodiment of the present invention.

FIG. 14 is a circuit diagram showing a driver circuit having the semiconductor device 100 according to the fourth embodiment. The configuration shown in FIG. 14 is the same as the one shown in FIG. 4 of the first embodiment, except that the anode electrode of the first diode 128 is connected to the anode electrode 172 by the metal line 128m and the cathode electrode is connected to the cathode electrode 173 connected directly to the ground (GND) terminal i. Note that in FIG. 14 the small black circles represent the connecting points or electrodes of the circuits, and the small squares represent the connections to the respective circuit regions.

Flows of the gate control signals are described with reference to FIGS. 12 and 14. The GND potential-based gate control signal is input from the microcomputer or the like to the input control circuit 136 that is operated based on the first potential, the GND potential.

The first potential-based gate control signal that is output from the input control circuit 136 is input to the gate of the first field effect transistor Q1 configuring the Pch level shifter 131 of the first level down circuit 139, and is then converted into a gate control signal based on the third potential, a floating potential of the p-type bulk substrate 101.

The gate control signal with the third potential as a reference potential is input to the gate of the second field effect transistor Q2 configuring the Nch level shifter 132 of the first level up circuit 140, and is then converted into a gate control signal based on the second potential, the VS potential.

The second potential-based gate control signal is transmitted to the high-side gate driver circuit 137. The high-side gate driver circuit 137 outputs a gate control signal for driving the external high-side power device (IGBT) 501.

The two Pch level shifters 131 are a setting level shifter for turning the gate control signals on and a resetting level shifter for turning the gate control signals off, and are operated only when the levels of the gate control signals change. Therefore, the power consumption of the level shifters can be reduced more than when only one level shifter is used. Much the same is true of the operations of the two Nch level shifters 132. Note that FIG. 14 only shows the setting Pch level shifter 131 and the setting Nch level shifter 132.

The substrate resistances are described next, as well as the concentrations Na and diffusion depths Xj of the primary diffusion regions. The p-type bulk substrate 101 has a specific resistance of 300 Ωcm to 500 Ωcm. The n diffusion region 102 configuring the first semiconductor region, the n diffusion region 103 configuring the second semiconductor region, and the n diffusion region 144 each have Na of $4 \times 10^{16}/cm^3$ and Xj of 12 μm. The n⁻ diffusion region 104 configuring the fifth semiconductor region, the n⁻ diffusion region 105, the n⁻ diffusion region 106 configuring the seventh semiconductor region, and the n⁻ diffusion region 145 each have Na of $7 \times 10^{15}/cm^3$ and Xj of 10 μm. The p diffusion region 117, the p⁻ diffusion region 118 configuring the sixth semiconductor region, the p⁻ diffusion region 119 configuring the eighth semiconductor region, p⁻ diffusion region 120, and the p⁻ diffusion region 146 each have Na of $6 \times 10^{15}/cm^3$ and Xj of 2 μm. The p⁻ diffusion region 147 has Na of $4 \times 10^{15}/cm^3$ and Xj of 10 μm. The width of the second high voltage junction terminating structure 130a is approximately 200 μm. The p⁻ diffusion region 180 is designed to have a width of approximately 1 μm to 7 μm and a concentration Na of $4 \times 10^{15}/cm^3$ so as to be completely depleted when a voltage is applied between the VB terminal and the Psub terminal.

Reactions that occur when a negative voltage surge is generated are described next with reference to FIGS. 2 and 4. When the second potential which is the VS potential and the fourth potential which is the VB potential drop below the first potential which is the GND potential by, for example, 200 V due to application of a negative voltage surge, the second parasitic diode 142 is biased forward, as in the conventional HVIC 200.

The first diode 128, on the other hand, enters the OFF state at the time of the occurrence of the negative voltage surge, due to a reverse bias. Because the path passing through the OFF first diode 128 is formed only between the ground (GND) terminal i and the second parasitic diode 142, no current flows to the second parasitic diode 142 even when a negative voltage surge is generated. For this reason, a potential difference equal to or greater than 0.6 V, which is a forward voltage of the second parasitic diode 142, is not generated between the p-type bulk substrate 101 configuring the second parasitic diode 142 and the VB terminal a.

When a negative voltage surge is generated, the Psub potential conforms with the VS potential and the VB potential, with constant potential differences therewith, and becomes lower than the GND potential. The low-side circuit region 133 is surrounded by the second high voltage junction terminating structure 130a having a breakdown voltage of approximately 1200 V, as described above. The breakdown voltage between the low-side circuit region 133 and the p-type bulk substrate 101 can be kept, even when the third potential, the Psub potential, becomes lower than the first potential, the GND potential, by approximately 1200 V, thereby enabling a normal operation of the input control circuit 136 based on the GND potential.

In addition, even when the third potential is reduced to below the first potential by approximately 1200 V by the first field effect transistor Q1 that configures the Pch level shifter 131 having a breakdown voltage of approximately 1200 V, the gate control signals are transmitted normally to the second field effect transistor Q2 configuring each Nch level shifter.

With the foregoing operations, up to a negative voltage surge of approximately 1200 V, the semiconductor device 100 of the fourth embodiment can normally be operated without causing a malfunction of the high-side gate driver circuit 137.

The present invention can prevent the occurrence of a potential difference equal to or greater than 0.6 V between the third potential and the fourth potential, even when a negative voltage surge is generated. Consequently, a surge current that flows from the surge current path passing through the second parasitic diode 142 to the high-side gate driver circuit 137 can be suppressed. This effect can prevent a malfunction of the high-side gate driver circuit 137 that could occur due to a negative voltage surge.

In this semiconductor device 100, the third potential is fixed between the first potential through the added first diode 128 and +0.6 V, enabling normal operation of the semiconductor device 100 at all times.

Moreover, the semiconductor device 100 can accomplish cost reduction because such negative voltage power supplies as those of Patent Literatures 2 and 3 are not required. Furthermore, cost reduction can be expected by the use of the self-isolation type process in place of the dielectric isolation type or junction isolation type process.

Note that a method for connecting current mirror circuits between the drain of the Pch level shifter 131 (p⁺ diffusion region 113) and the first level shift resistor 126 and between the drain of the Nch level shifter 132 (n⁻ diffusion region 116) and the second level shift resistor 127 to let currents flow to the first level shift resistor 126 and the second level shift resistor 127, and a method for connecting the bases of pnp transistors or npn transistors to the drains to let currents flow to the first level shift resistor 126 and the second level shift resistors 127 through the transistors, can be used as the first level down circuit 139 and the first level up circuit 140.

Fifth Embodiment

A fifth embodiment of the present invention is described next with reference to FIGS. 15 to 18.

Figure 15:
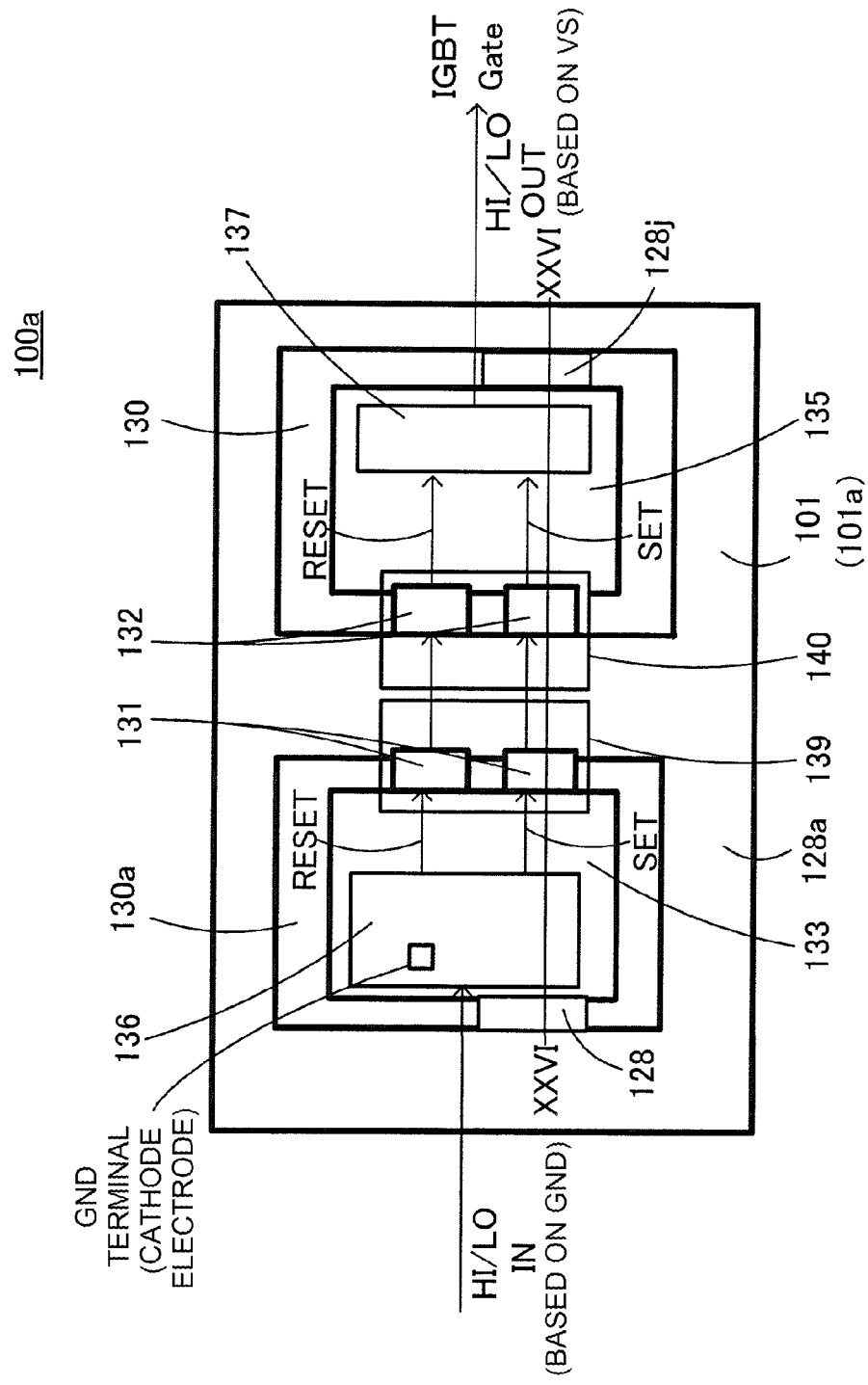
FIG. 15 is a plan view showing substantial parts of a semiconductor device according to a fifth embodiment of the present invention.
Figure 16:
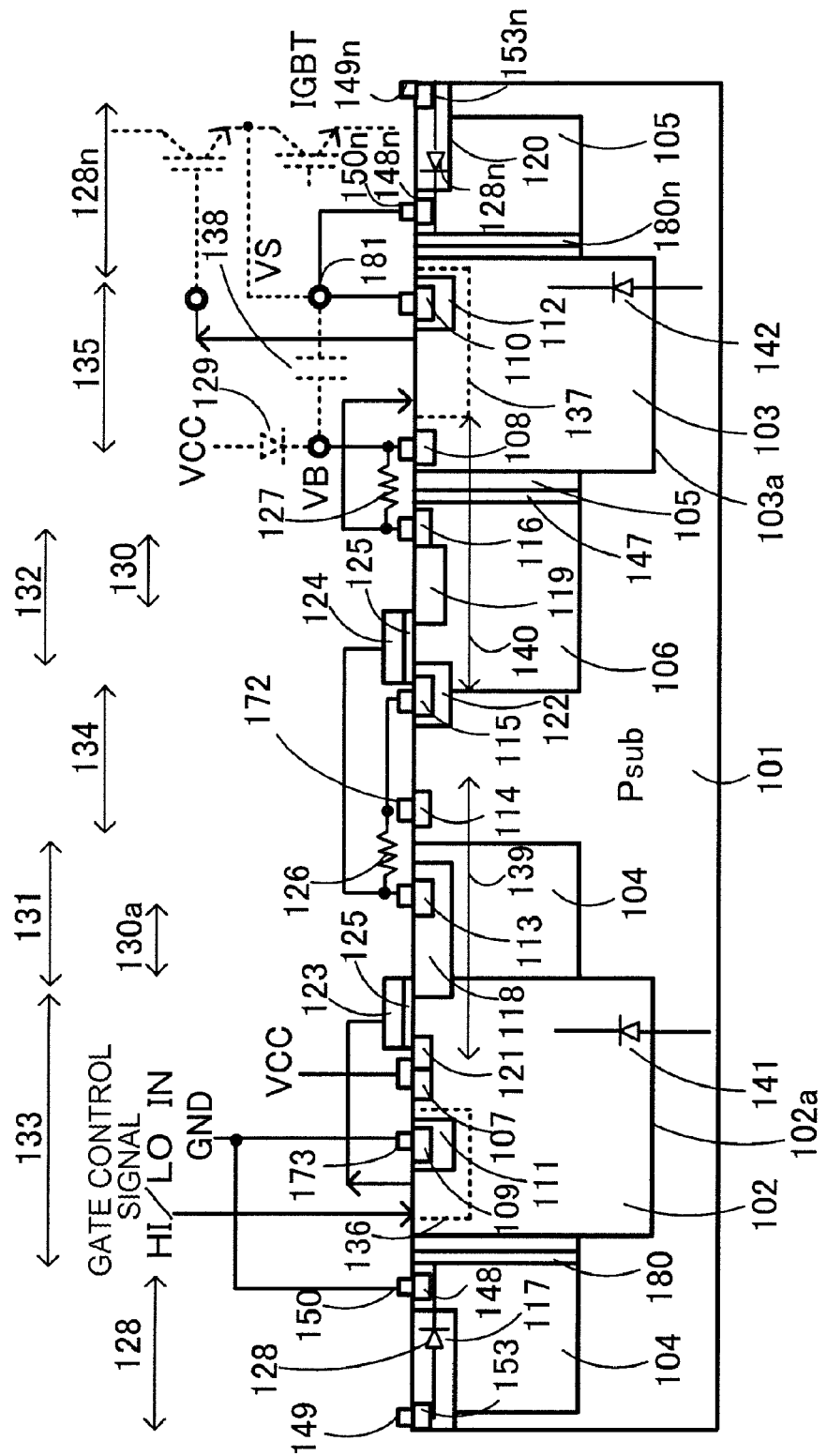
FIG. 16 is a cross-sectional diagram of the substantial parts, taken along line XVI-XVI of FIG. 15.
Figure 17:
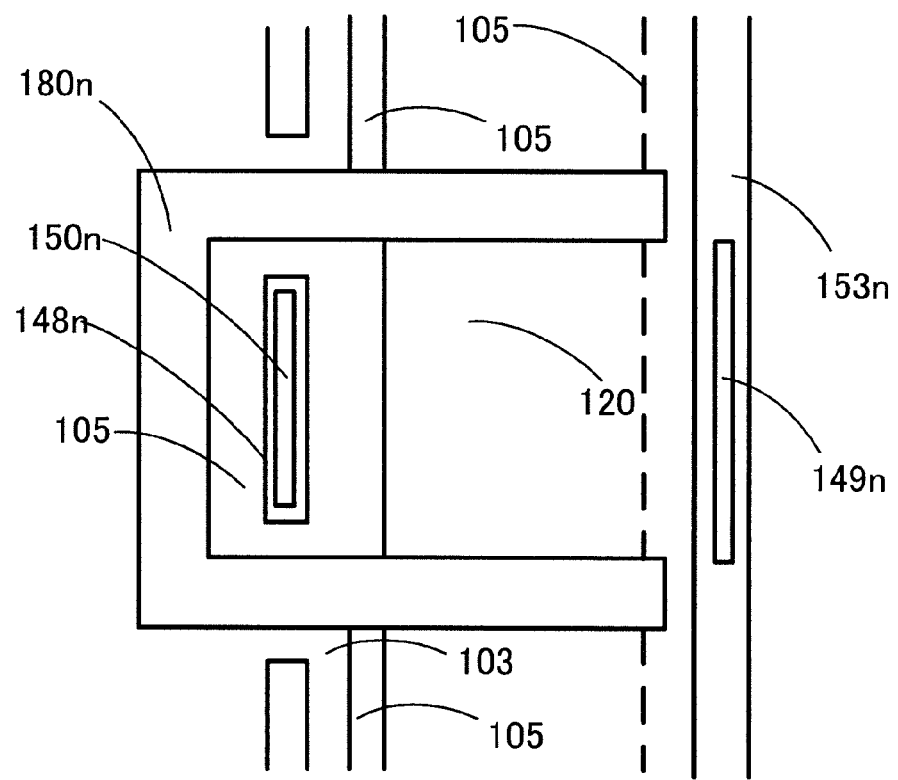
FIG. 17 is a plan view of the substantial parts of the third diode.
Figure 18:
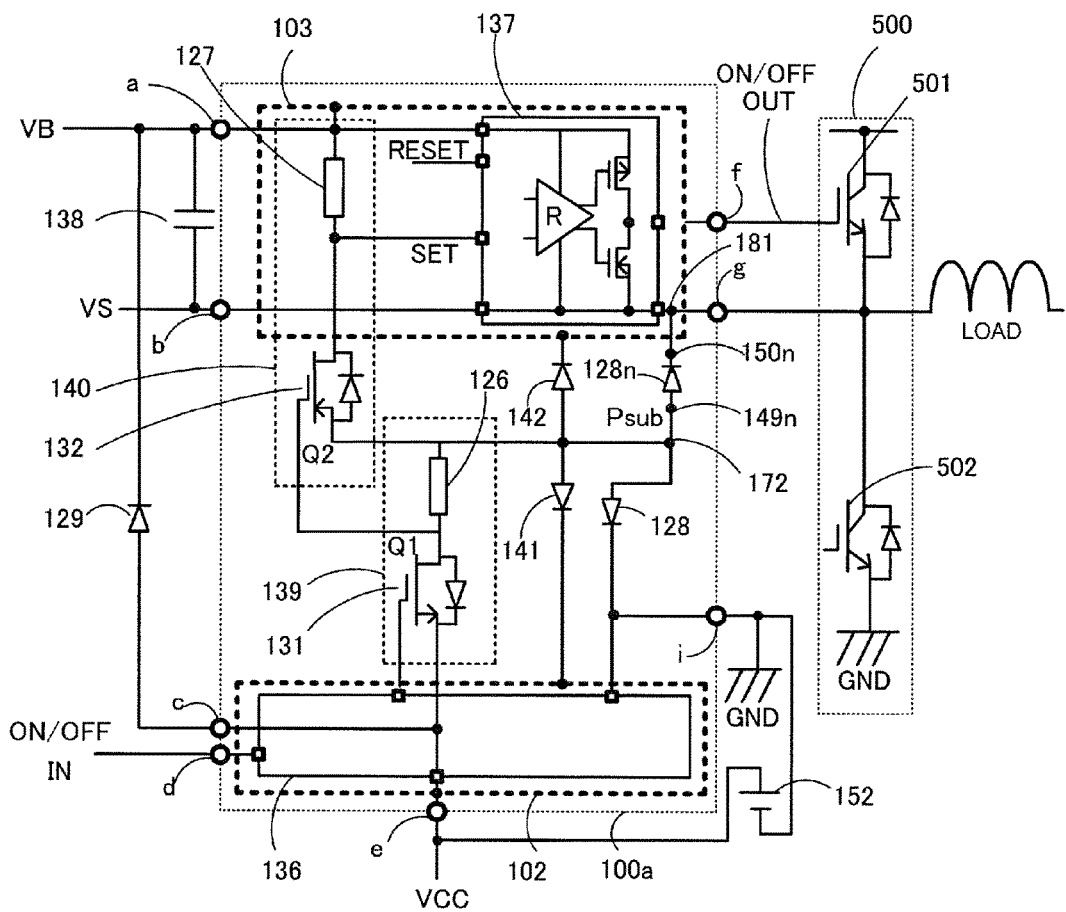
FIG. 18 is a circuit diagram of a driver circuit having the semiconductor device according to the fifth embodiment of the present invention.

FIG. 15 is a plan view showing substantial parts of the semiconductor device 100a according to the present invention. FIG. 16 is a cross-sectional diagram showing the substantial parts of the semiconductor device 100a. FIG. 17 is a circuit diagram showing a driver circuit having the semiconductor device 100a.

As with the third embodiment, the semiconductor device according to the fifth embodiment has the first diode 128 and a second diode 128n of the same structure as the first diode 128.

The second diode 128n is formed integrally with the first high voltage junction terminating structure 130 surrounding the high-side circuit region 135, as shown in FIGS. 15 and 16.

Specifically, the second diode 128n is formed on the side opposite to the first level up circuit 140 of the first high voltage junction terminating structure 130, with the high-side circuit region 135 therebetween. As shown in FIG. 16, the main part of the second diode 128n is configured by turning the configuration of the same shown in FIG. 13 of the fourth embodiment 180 degrees.

In other words, the second diode 128n is a lateral high voltage diode having a breakdown voltage of approximately 1200 V and is integrated with the first high voltage junction terminating structure 130. The breakdown voltage structure is a double-RESURF structure configured with the p-type bulk substrate 101, the n⁻ diffusion region 105 formed in the front surface layer of the p-type bulk substrate 101, and the p⁻ diffusion region 120 formed in the front surface layer of the n⁻ diffusion region 105.

The components of the cathode of the second diode 128n include the n⁻ diffusion region 105 that configures a drift region and is formed in the front surface layer of the p-type bulk substrate 101. The components also include an n⁺ diffusion region 148n formed in the front surface of the n⁻ diffusion region 105 and a cathode electrode 150n for the purpose of establishing a contact. The components of the anode include the p diffusion region 120 configuring the double-RESURF structure. The components also include a p⁺ diffusion region 153n and an anode electrode 149n for the purpose of establishing a contact.

The n– diffusion region 105 configuring the cathode of the second diode 128n is electrically isolated from the n⁻ diffusion region 105 configuring the first high voltage junction terminating structure 130 by a p⁻ diffusion region 180n. This isolation prevents leakage of current between the second diode 128n and the first high voltage junction terminating structure 130.

The anode electrode 149n is connected to the anode electrode 172, and the cathode electrode 150n of the second diode 128n is connected to a VS terminal 181.

The semiconductor device 100 illustrated in the fourth embodiment is capable of suppressing a surge current when a negative voltage surge occurs and hence preventing a malfunction of the high-side gate driver circuit 137. However, because the first level up circuit 140 does not operate normally during a period in which the VB potential is lower than the Psub potential, the gate control signals cannot be transmitted to the high-side gate driver circuit 137.

The semiconductor device 100a according to the fifth embodiment, on the other hand, is capable of causing the second diode 128n to prevent the fourth potential, the VB potential, from dropping below the third potential which is the Psub potential. Therefore, the first level up circuit 140 can be operated normally even when a negative voltage surge occurs, enabling transmission of the gate control signals to the high-side gate driver circuit 137. Therefore, the semiconductor device 100a can not only prevent a malfunction of the high-side gate driver circuit 137 but also normally transmit the gate control signals from the microcomputer and the like to the high-side power device 501 such as an IGBT even when a negative voltage surge is generated.

Sixth Embodiment

A sixth embodiment of the present invention is described next with reference to FIG. 19.

The first level down circuit 139 described in the first embodiment is omitted in the sixth embodiment.

Figure 19:
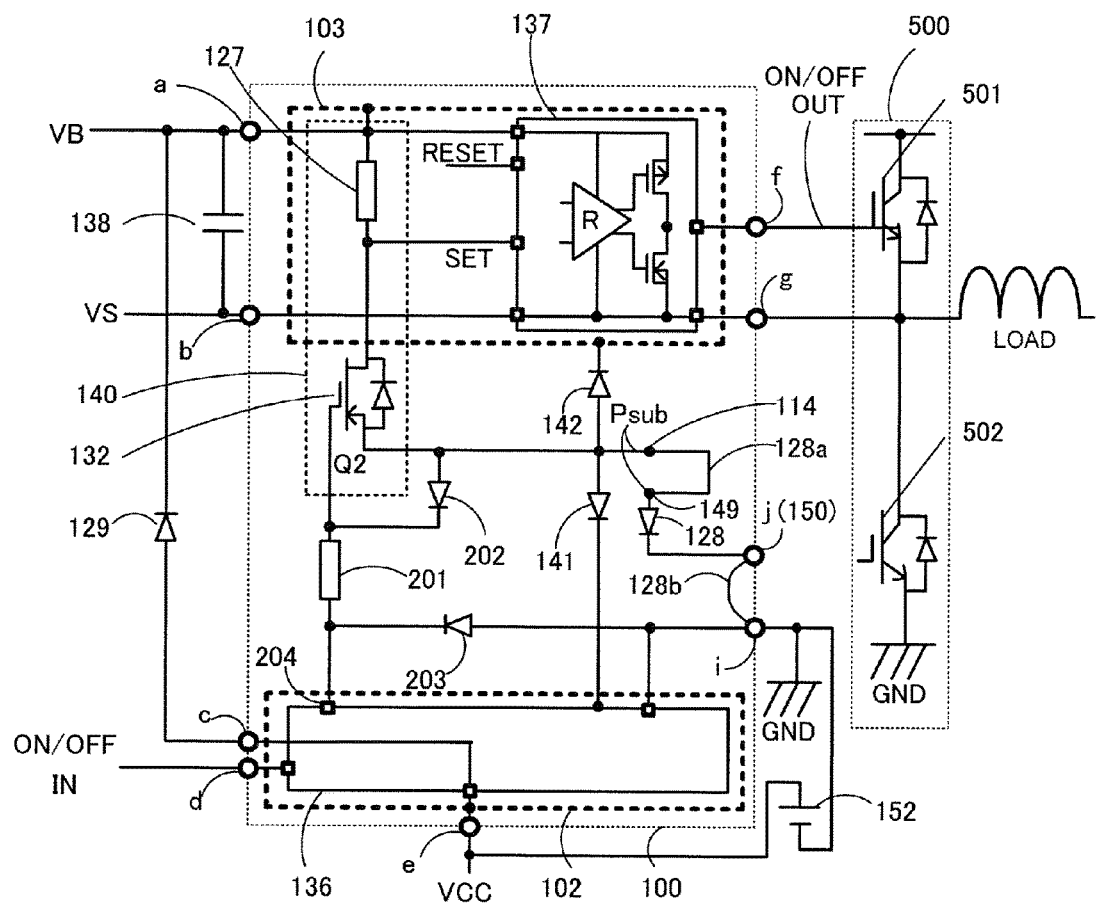
FIG. 19 is a circuit diagram of a driver circuit having a semiconductor device according to a sixth embodiment of the present invention.

In other words, in the sixth embodiment, the configuration shown in FIG. 4 of the first embodiment omits the first level down circuit 139 and instead incorporates a gate resistor 201, as shown in FIG. 19. The gate resistor 201 has its one end connected to a gate control signal output terminal 204 of the input control circuit 136 and the other end to the gate of the second field effect transistor Q2 configuring each Nch level shifter 132 of the first level up circuit 140.

In addition, a gate protection diode 202 is connected between the gate and source of the second field effect transistor Q2. The anode of a protective diode 203 is connected to the ground (GND) terminal i, while the cathode of the same is connected to the connecting point between the gate control signal output terminal 204 of the input control circuit 136 and the gate resistor 201.

Operations of the sixth embodiment are now described. When a negative voltage surge is not generated, a gate drive signal that is output from the gate control signal output terminal 204 in response to an input signal is transmitted to the high-side gate driver circuit 137 via the gate resistor 201 and first level up circuit 140, and as a result the gate of the high-side power device 501 is driven.

When a negative voltage surge occurs at the VS terminal, the potential of the p⁺ diffusion region 114 conforms with the potential of the VS terminal with a constant voltage difference therebetween. This is because the p+ diffusion region 114 is connected to the VS terminal via the second parasitic diode 142 and bootstrap capacitor 138.

At that moment, because the first diode 128 connected between the P⁺ diffusion region 114 and the GND is in a reverse-biased state, surge currents, a cause of malfunctions of the circuits, do not flow to the second parasitic diode 142, preventing malfunctions of the circuits that are caused by a negative voltage surge.

In addition, although a large negative voltage resulting from a negative voltage surge is applied to the high voltage Nch level shifter 132 connected to the P⁺ diffusion region 114, the gate protection diode 202 prevents application of a high voltage between the gate and the source.

Moreover, the protective diode 203 prevents application of a large negative voltage to the gate control signal output terminal 204. Although a large potential difference occurs between the gate control signal output terminal 204 and the gate of the second field effect transistor Q2 configuring the high voltage Nch level shifter 132, the gate resistor 201 prevents a large current from flowing therebetween.

Seventh Embodiment

A seventh embodiment of the present invention is described next with reference to FIG. 20.

The seventh embodiment illustrates an example in which, in place of the gate driver circuit, only an abnormality detection circuit 137b is installed in the high-side circuit region 135.

Figure 20:
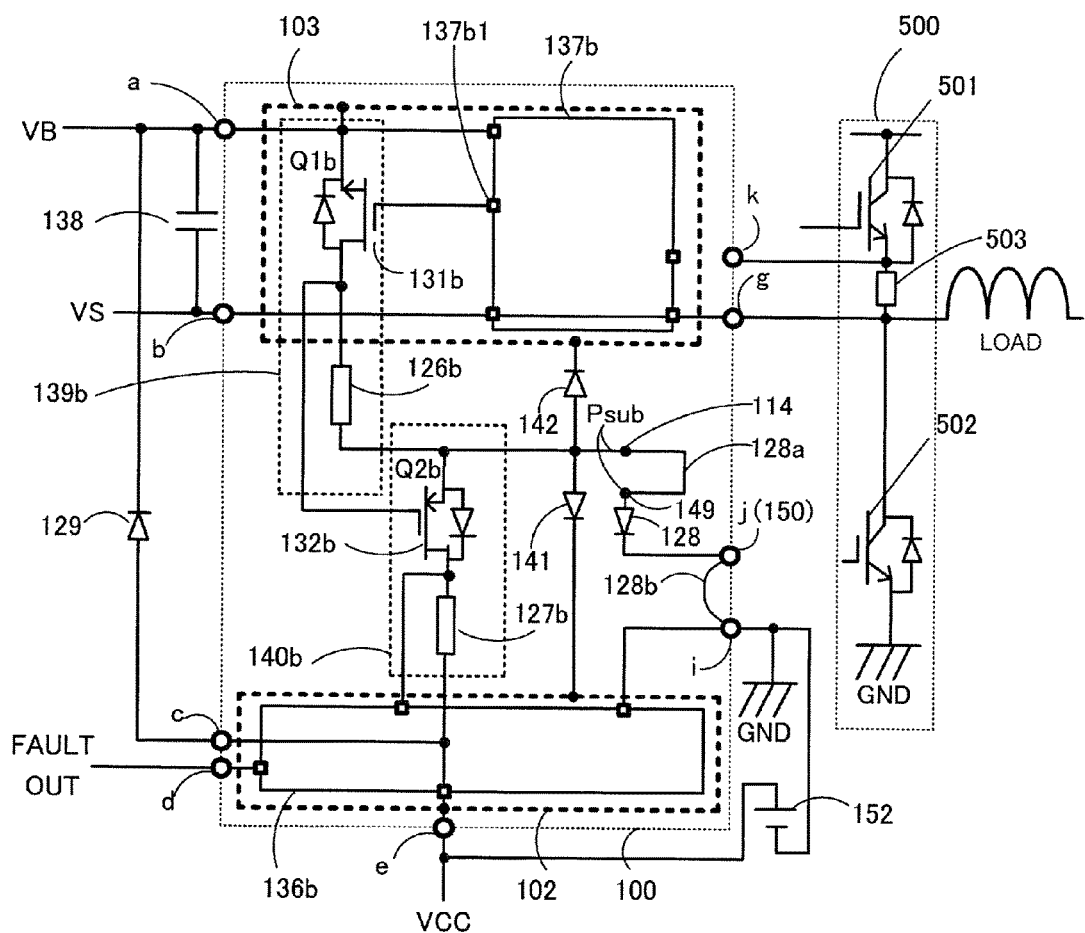
FIG. 20 is a circuit diagram of a driver circuit having a semiconductor device according to a seventh embodiment of the present invention.

Specifically, in the seventh embodiment, the gate driver circuit is not installed in the high-side circuit region 135, as shown in FIG. 20, in the high-side circuit region 135, the abnormality detection circuit 137b for detecting, for example, excess current of the high-side power device 501 is formed in the high-side circuit region 135. A terminal voltage of a shunt resistor 503 for detecting a current flowing to the high-side power device 501 is input as a current detection value to this abnormality detection circuit 137b through a current detection terminal k and the VS terminal g. The shunt resistor 503 is disposed between the high-side power device 501 and the VS terminal g.

When the current detection value which is the terminal voltage of the shunt resistor 503 that is input from the current detection terminal k and the VS terminal g is equal to or smaller than an allowable current value of the high-side power device 501, the abnormality detection circuit 137b determines that the current of the high-side power device 501 is normal. However, when the current detection value exceeds the allowable current value of the high-side power device 501, the abnormality detection circuit 137b determines that the current of the high-side power device 501 is abnormal and excessive, and then outputs a first abnormality detection signal from an abnormal signal output terminal 137b1.

Also, the abnormality detection circuit 137b is connected to an output control circuit 136b configuring the low-side circuit region 133 by a second level down circuit 139b and a second level up circuit 140b.

The second level down circuit 139b is configured by a series circuit of a Pch level shifter 131b and a first level shift resistor 126b that are connected between a VB terminal a and a VB input terminal of the abnormality detection circuit 137b. The Pch level shifter 131b is configured with a first field effect transistor Q1b that is formed integrally with a second high voltage junction terminating structure 130b. The first abnormality detection signal that is output from the abnormality signal output terminal 137b1 of the abnormality detection circuit 137b is input to the gate of the first field effect transistor Q1b. The connecting terminal of the first level shift resistor 126b that is located on the side opposite to the first field effect transistor Q1b is connected to the connecting point among the first parasitic diode 141, second parasitic diode 142, and first diode 128. A second abnormality detection signal of lowered level is output from the connecting point between the drain of the first field effect transistor Q1b and the first level shift resistor 126b.

The second level up circuit 140b is configured by a series circuit of a Nch level shifter 132b and a second level shift resistor 127b. The Nch level shifter 132b is configured with a second Nch field effect transistor Q2b that is formed integrally with the first high voltage junction terminating structure 130.

The source of the second field effect transistor Q2b is connected between the second level down circuit 139b and the connecting point between the first parasitic diode 141 and the second parasitic diode. The connecting terminal of the second level shift resistor 127b that is located on the side opposite to the second field effect transistor Q2b is connected to the VCC terminal e and to the connecting terminal c.

The second abnormality detection signal that is output from the second level down circuit 139b is input to the gate of the second field effect transistor Q2b, and a third abnormality detection signal of increased level is output from the connecting point between the second field effect transistor Q2b and the second level shift resistor 127b.

This third abnormality detection signal is input to the output control circuit 136b, and an abnormality detection signal is output from this output control circuit 136b to an external controller through a signal output terminal d1.

Operations of the seventh embodiment are described next. The abnormality detection circuit 137b monitors the voltages of both terminals of the shunt resistor 503 at all times. When excess current flows to the high-side power device 501, the voltages of both terminals of the shunt resistor 503 increase, whereby the excess current is detected. In response to this detection, an abnormality detection signal is transmitted to the output control circuit 136b via the second level down circuit 139b and second level up circuit 140b, and the abnormality detection signal is output from the output control circuit 136b.

When a negative voltage surge occurs at the VS terminal, the first diode 128 prevents a negative surge current from flowing from the ground (GND) terminal i to the abnormality detection circuit 137b as in the first embodiment, preventing a malfunction of the abnormality detection circuit 137b. Although the present embodiment has described how excessive current is detected, the present invention is not limited thereto. Therefore, the present invention can also be applied to an abnormality detection circuit that detects other abnormalities such as a decrease in voltage of the bootstrap capacitor 138 and excessive heating of the power device 501 at the upper arm side.

Eighth Embodiment

Figure 21:
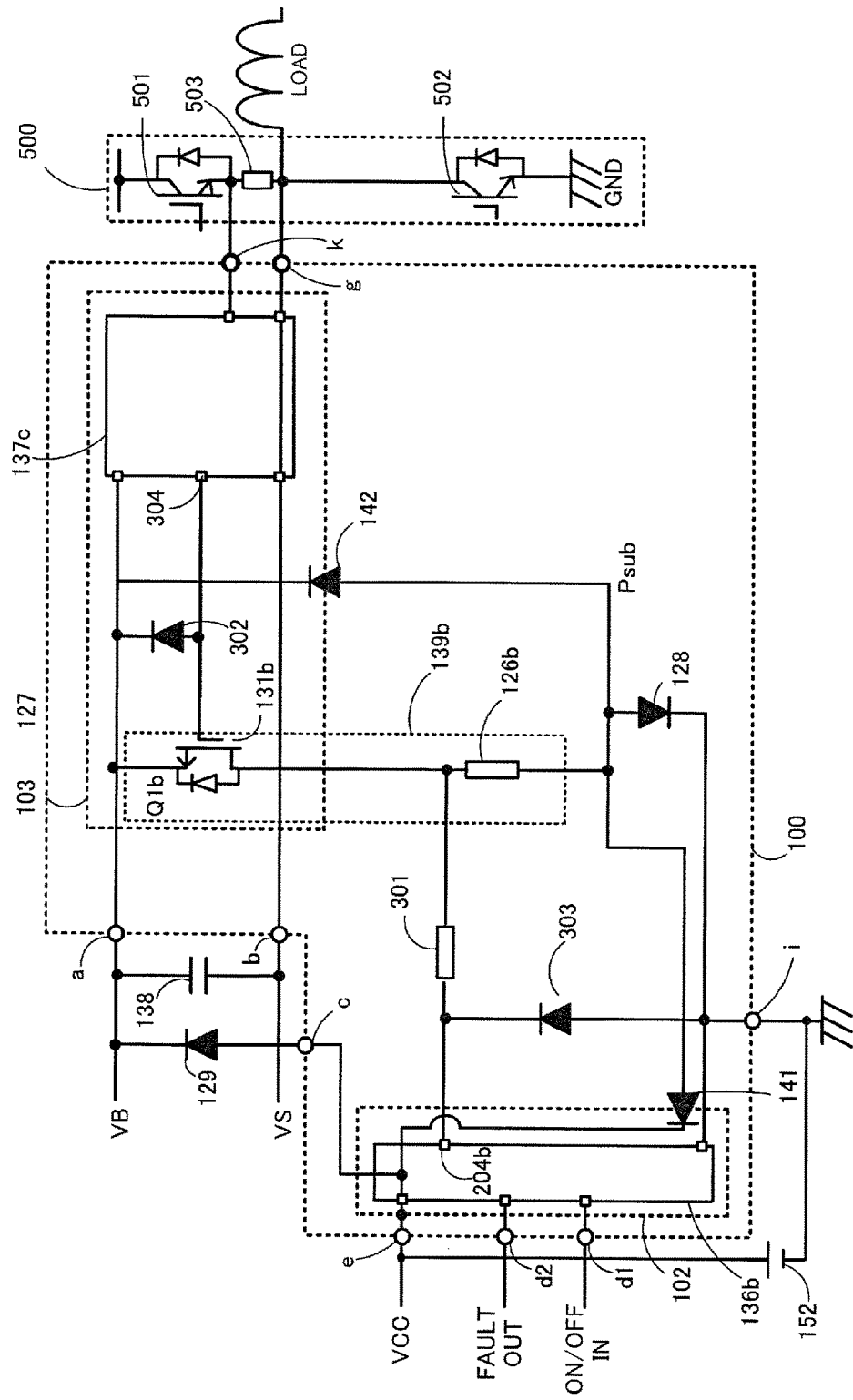
FIG. 21 is a circuit diagram of a driver circuit having a semiconductor device according to an eighth embodiment of the present invention.

An eighth embodiment illustrating an example of the present invention is described next with reference to FIG. 21.

The second level up circuit of the seventh embodiment is omitted in the eighth embodiment.

Specifically, in the eighth embodiment, the second abnormality detection signal of lowered level which is output from the second level down circuit 139b is input as the third abnormality detection signal to the output control circuit 136b via a high voltage resistor 301.

The gate of the first field effect transistor Q1b that configures the high voltage Pch level shifter 131b configuring the second level down circuit 139b is connected to the abnormality signal output terminal 137b1 of the abnormality detection circuit 137b. A gate protection diode 302 having a breakdown voltage of approximately 25 V is connected between the gate and source of the first high breakdown voltage field effect transistor Q1b. A protective diode 303 having a breakdown voltage of approximately 25 V is connected between an abnormality signal input terminal 204b and the GND terminal i.

Operations of the eighth embodiment are described next. While a negative voltage surge does not occur, the level of the first abnormality detection signal that is output from the abnormality signal output terminal 137b1 is lowered by the second level down circuit 139b in response to an abnormality detection by the abnormality detection circuit 137b. The second abnormality detection signal of lowered level is transmitted to the output control circuit 136b via the high voltage resistor 301, and an abnormality detection signal is output from the output control circuit 136b.

Conversely, when a negative voltage surge occurs at the VS terminal, the potential of the p$^+$ diffusion region 114 formed on the front surface side of the p-type bulk substrate 101 conforms with the potential of the VS terminal with a constant potential difference therewith. This is because the P$^+$ diffusion region 114 is connected to the VS terminal via the second parasitic diode 142 and bootstrap capacitor 138. At this moment, because the first diode 128 connected between the P$^+$ diffusion region 114 and the GND terminal i is in a reverse-biased state, surge currents, a cause of malfunctions of the circuits, do not flow to the second parasitic diode 142, preventing malfunctions of the circuits that are caused by a negative voltage surge of the abnormality detection circuit 137b formed in the high-side circuit region 135.

In addition, although a large negative voltage resulting from a negative voltage surge is applied to the first field effect transistor Q1b that configures the high voltage Pch level shifter 131b connected to the P$^+$ diffusion region 114, the gate protection diode 302 prevents application of a high voltage between the gate and the source. Moreover, the protective diode 303 prevents application of a large negative voltage to the abnormality signal input terminal 204b. Although a negative voltage surge causes a large potential difference between the abnormality signal input terminal 204b and the drain of the second field effect transistor Q2b configuring the high voltage Nch level shifter 131b, the high voltage resistor 301 prevents a large current from flowing therebetween.

Ninth Embodiment

A ninth embodiment, an example of the present invention, is described next with reference to FIG. 22.

The ninth embodiment is a combination of the first embodiment and the seventh embodiment.

Figure 22:
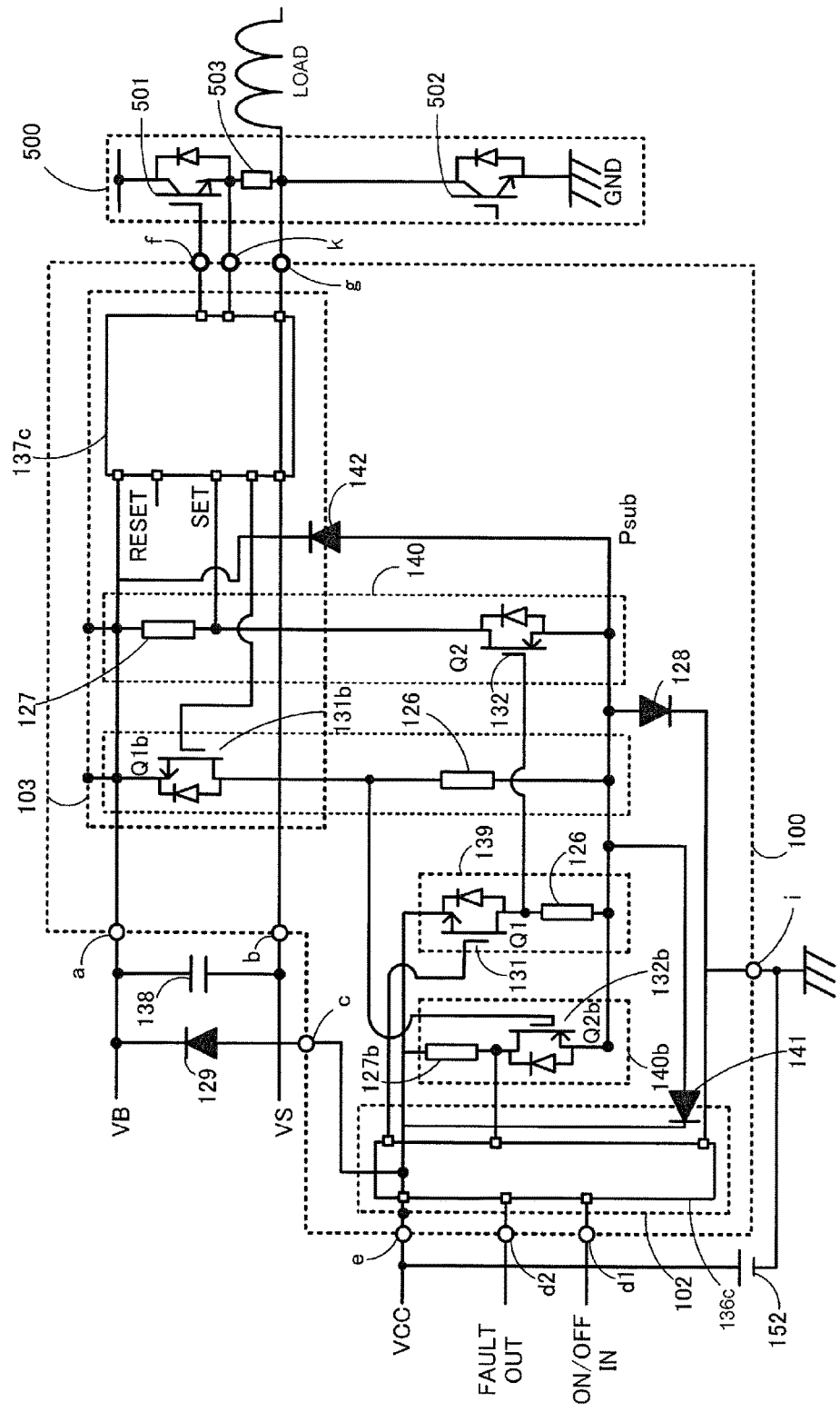
FIG. 22 is a circuit diagram of a driver circuit having a semiconductor device according to a ninth embodiment of the present invention.

Specifically, in the ninth embodiment, a composite circuit 137c with a combination of the high-side gate driver circuit 137 of the first embodiment and the abnormality detection circuit 137b of the eighth embodiment is formed in the n diffusion region 103, the second semiconductor region configuring the high-side circuit region 135, as shown in FIG. 22. In addition, an input/output control circuit 136c is formed in the n diffusion region 102, the first semiconductor region configuring the low-side circuit region 133.

A first gate control signal that is output from a gate control signal output terminal of the input/output control circuit 136c is input to a set terminal 137c1 of the composite circuit 137c via the first level down circuit 139 and first level up circuit 140.

On the other hand, a first abnormality detection signal that is output from an abnormality signal output terminal 137c2 of the composite circuit 137c is input as the third abnormality detection signal to the abnormality signal input terminal 204b of the input/output control circuit 136c via the second level down circuit 139b and second level up circuit 140b.

Furthermore, the first diode 128 is connected between the connecting point among the second level down circuit 139b, first level up circuit 140, second level up circuit 140b, first level down circuit 139, first parasitic diode 141 and second parasitic diode 142, and the ground (GND) terminal i.

In the ninth embodiment as well, when a negative voltage surge is generated at the VS terminal, the first diode 128 prevents a surge current from flowing to the composite circuit 137c, preventing a malfunction of the composite circuit 137c, as in the first embodiment and the seventh embodiment.

Tenth Embodiment

A tenth embodiment, an example of the present invention, is described next with reference to FIG. 23.

The tenth embodiment is a combination of the sixth embodiment and the eighth embodiment.

Figure 23:
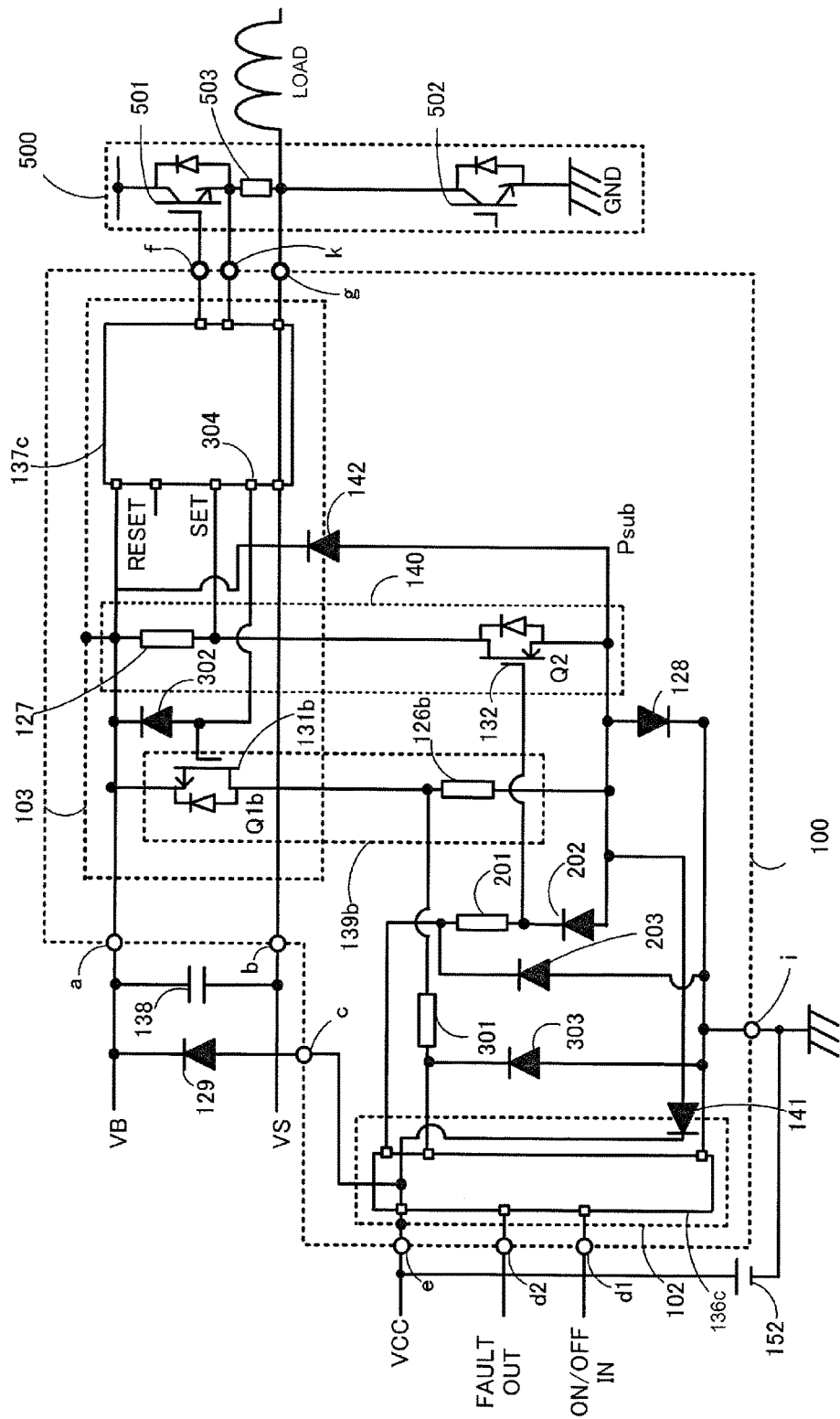
FIG. 23 is a circuit diagram of a driver circuit having a semiconductor device according to a tenth embodiment of the present invention.
Figure 24:
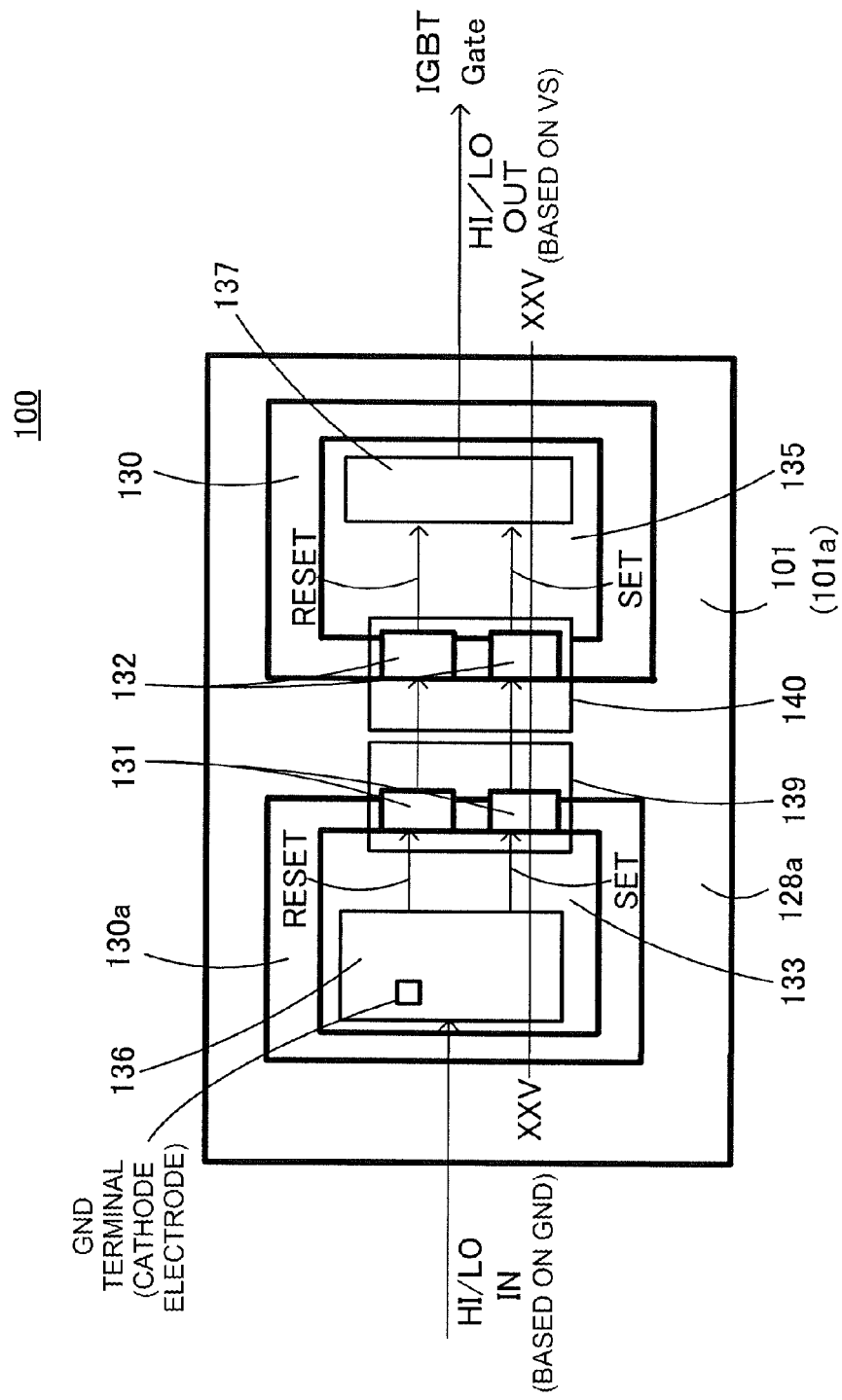
FIG. 24 is a plan view showing substantial parts of a semiconductor device according to an eleventh embodiment of the present invention.

Specifically, in the tenth embodiment, the composite circuit 137c with a combination of the high-side gate driver circuit 137 of the first embodiment and the abnormality detection circuit 137b of the eighth embodiment is formed in the n diffusion region 103, the second semiconductor region configuring the high-side circuit region 135, as shown in FIG. 23. In addition, the input/output control circuit 136c is formed in the n diffusion region 102, the first semiconductor region configuring the low-side circuit region 133.

A first gate control signal that is output from the gate control signal output terminal 204 of the input/output control circuit 136c is input to the set terminal 137c1 of the composite circuit 137c via the gate resistor 201 and first level up circuit 140.

On the other hand, the first abnormality detection signal that is output from the abnormality signal output terminal 137c2 of the composite circuit 137c is input as the third abnormality detection signal to the abnormality signal input terminal 204b of the input/output control circuit 136c via the second level down circuit 139b and high voltage resistor 301.

Furthermore, the first diode 128 is connected between the connecting point among the second level down circuit 139b, first level up circuit 140, first parasitic diode 141 and second parasitic diode 142, and the ground (GND) terminal i.

Also, the protective diodes 203 and 303 are connected between the ground (GND) terminal i and the gate resistor 201 and the high voltage resistor 301 at the input/output control circuit 136c side, respectively.

Additionally, the gate protection diode 202 is connected between the connecting point where the second level down circuit 139b and first level up circuit 140 are connected to the first diode 128 and the connecting point between the gate resistor 201 and the gate of the second field effect transistor Q2b configuring the Nch level shifter 132b. The gate protection diode 302 is connected between the gate and source of the first field effect transistor Q1b that configures the Pch level shifter 131b of the second level down circuit 139b. Moreover, the protective diode 303 is connected between the ground (GND) terminal i and the abnormality signal input terminal 204b of the input/output control circuit 136c.

In the tenth embodiment as well, when a negative voltage surge is generated at the VS terminal, the first diode 128 prevents a surge current from flowing to the composite circuit 137c, preventing malfunctions of the high-side gate driver circuit and abnormality detection circuit configuring the composite circuit 137c, as in the sixth embodiment and the eighth embodiment.

Eleventh Embodiment

An eleventh embodiment illustrating an example of the present invention is described next with reference to FIGS. 25 and 26.

In the eleventh embodiment the position of the first diode is changed.

Figure 25:
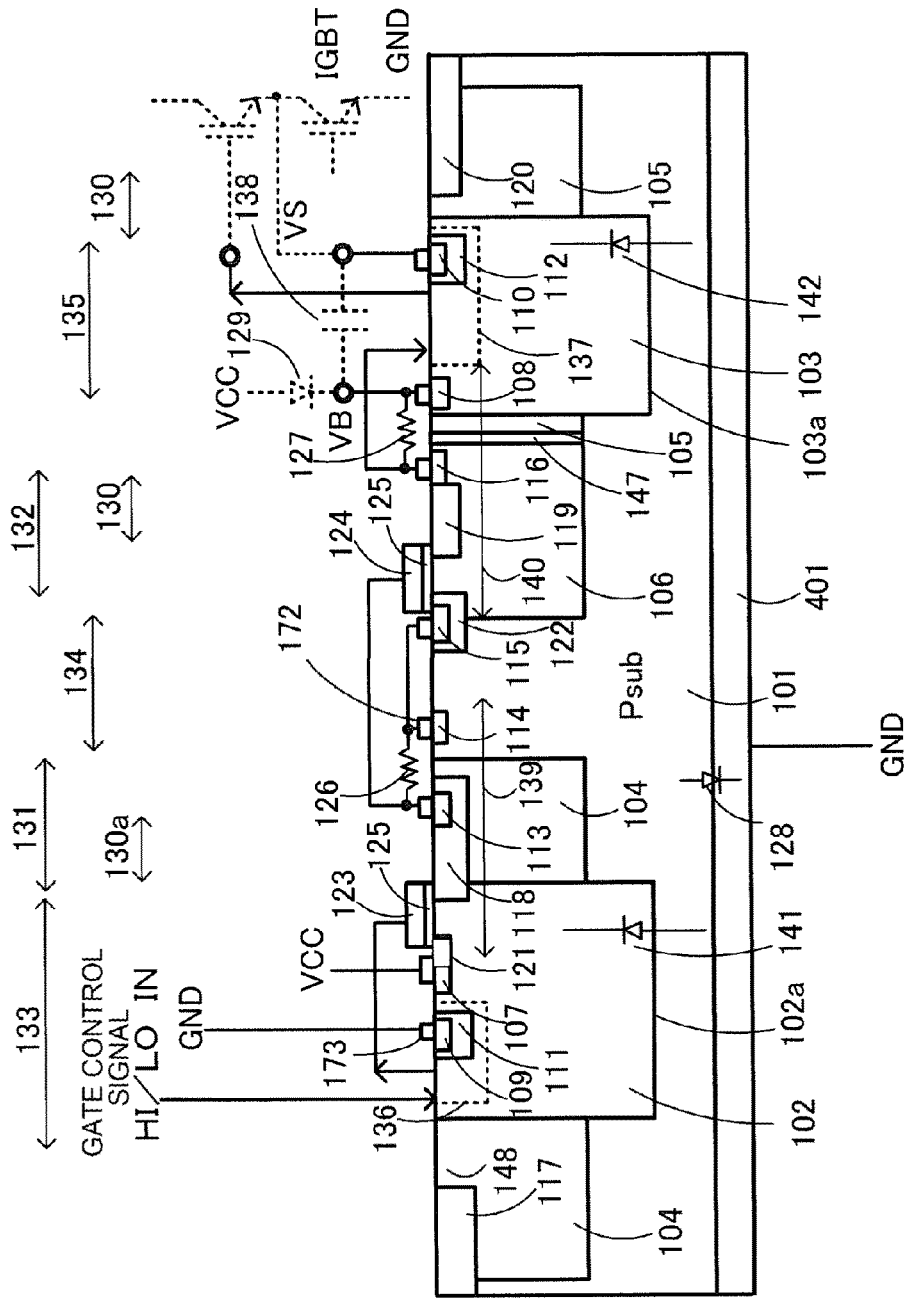
FIG. 25 is a cross-sectional diagram of the substantial parts, taken along line XXV-XXV of FIG. 24.
Figure 26:
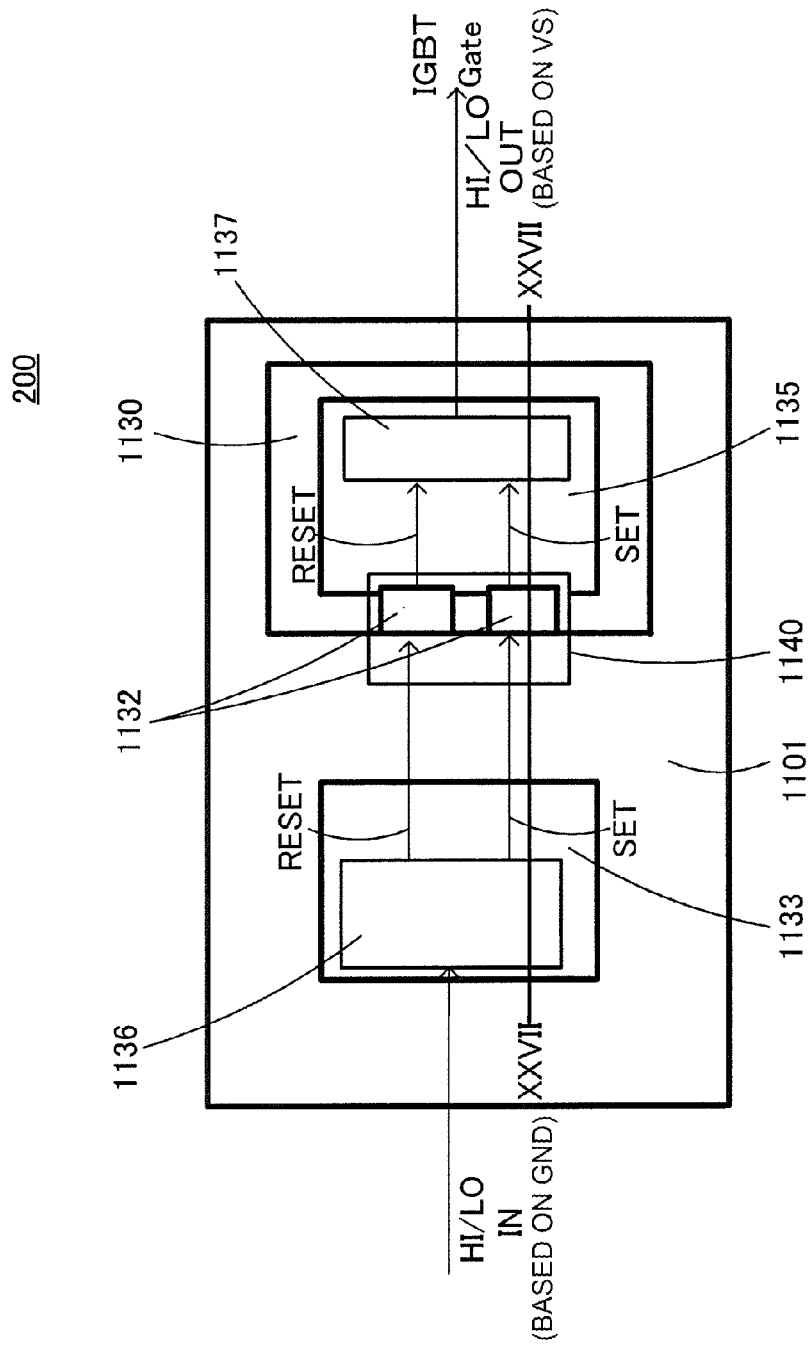
FIG. 26 is a plan view showing substantial parts of a conventional high voltage integrated circuit device.
Figure 27:
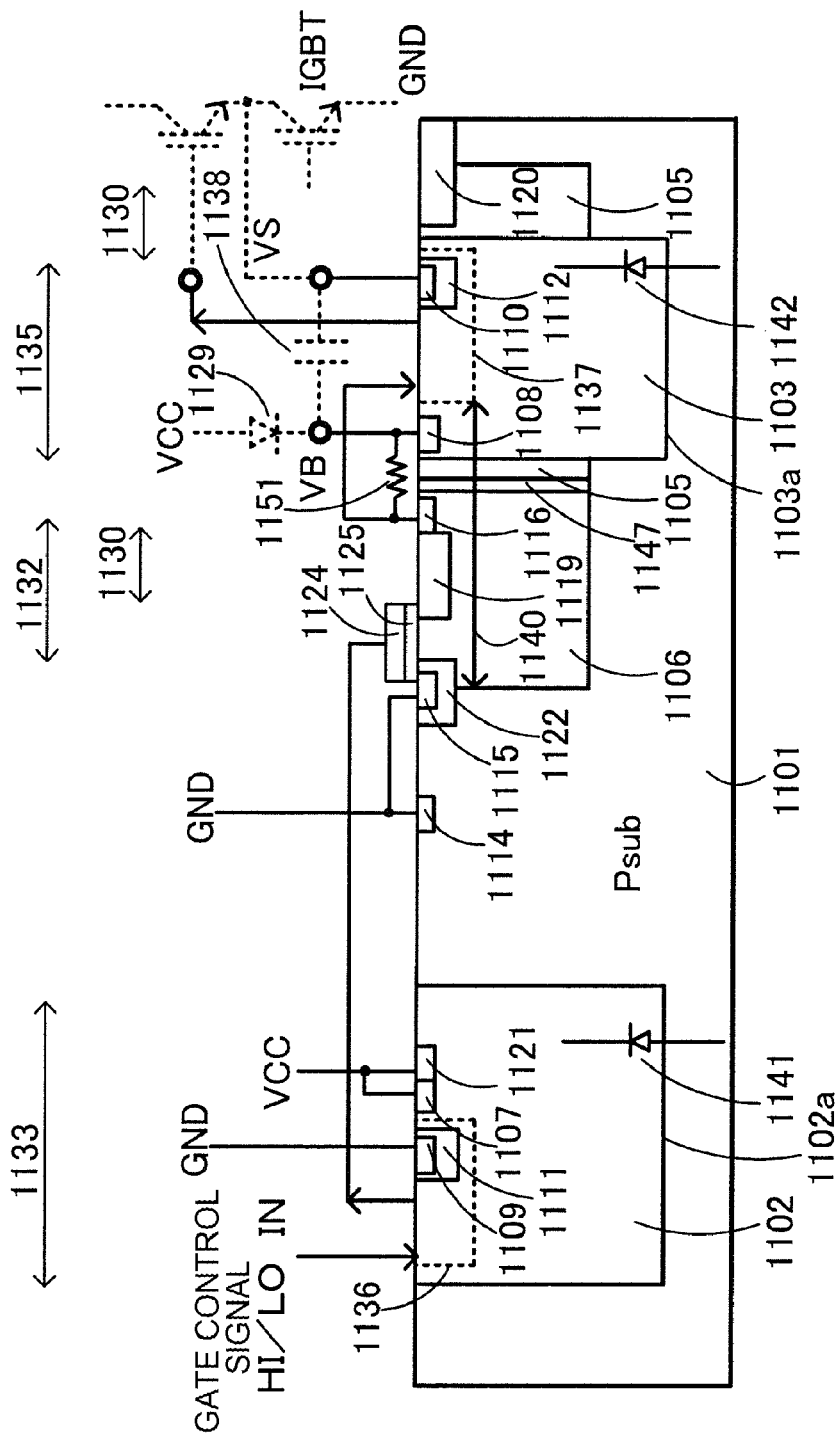
FIG. 27 is a cross-sectional diagram of the substantial parts, taken along line XXVI-XXVI of FIG. 26.
Figure 28:
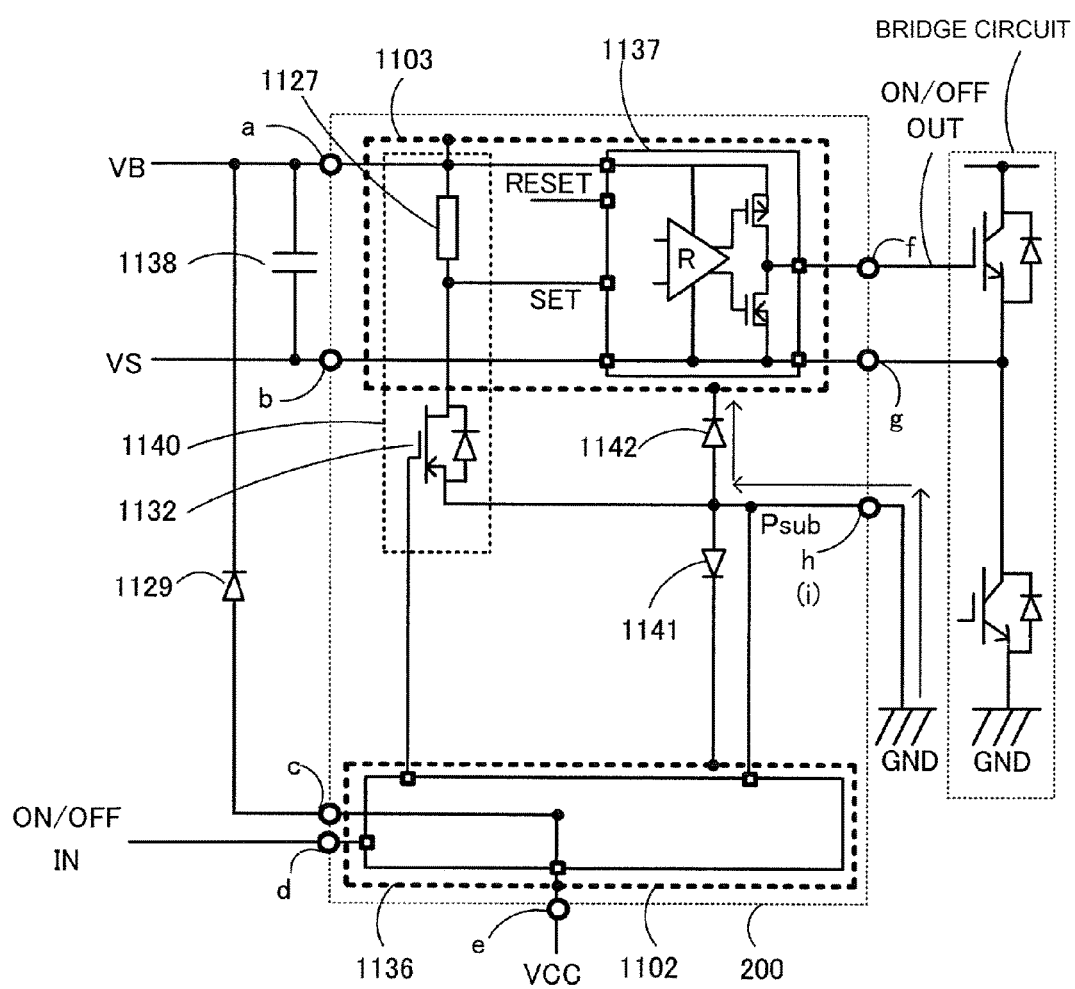
FIG. 28 is a circuit diagram of the high voltage integrated circuit device shown in FIG. 26.

Specifically, in the eleventh embodiment, the first diode 128 that is formed on the front surface side of the p-type bulk substrate 101 connected to the anode electrode 172 of the first embodiment is omitted, as shown in FIGS. 25 and 26. Instead, the first diode 128 is formed on the rear surface side of the p-type bulk substrate 101.

In order to form the first diode 128, an n-type layer 401 is formed on the rear surface side of the p-type bulk substrate 101, in which the p-type bulk substrate 101 is taken as the anode of the first diode and the n-type layer 401 as the cathode. The n-type layer 401 is connected to the ground (GND).

In the eleventh embodiment as well, when a negative voltage surge is generated at the VS terminal, the first diode 128 prevents a surge current from flowing to the high-side gate driver circuit 137, preventing a malfunction of the high-side gate driver circuit 137, as in the first embodiment.

Moreover, because the first diode 128 is formed on the rear surface side of the p-type bulk substrate 101 configuring a semiconductor layer, while the semiconductor device 100 becomes somewhat thicker, the area of the p-bulk substrate 101 as viewed planarly can be made smaller than that described in the first embodiment, accomplishing size reduction of the semiconductor device 100.

In the first to eleventh embodiments, as long as the voltage of a negative voltage surge is lower than 1200 V, the areas of the second high voltage junction terminating structure 130a and Pch level shifter 131 can be made small. In addition, when the voltage of a negative voltage surge is low, the second high voltage junction terminating structure 130a does not have to be provided. When not forming the second high voltage junction terminating structure 130*a*, the drain region of the Pch level shifter 131 can be formed within the low-side circuit region.

Moreover, although the first to eleventh embodiments have described that the breakdown voltage 130 of the first high voltage junction terminating structure is 1200 V, the breakdown voltage of the first high voltage junction terminating structure 130 may be approximately equal to or higher than 600 V when the voltage of a high voltage power supply is 200 V, or may be approximately equal to or higher than 400 V when the voltage of the high voltage power supply is 100 V.

EXPLANATION OF REFERENCE NUMERALS 100, 300 . . . Semiconductor device
101 . . . P-type bulk substrate
101*a* . . . P diffusion isolation region
102 . . . N diffusion region (first semiconductor region)
103 . . . N diffusion region (second semiconductor region)
105, 144 . . . N⁻ diffusion region
102*a*, 103*a* . . . Junction
102*b*, 103*b* . . . Buried region
104 . . . N⁻ diffusion region (fifth semiconductor region)
106 . . . N⁻ diffusion region (seventh semiconductor region)
106, 145 . . . N⁻ diffusion region
104*a*, 105*a*, 106*a*, 145*a* . . . N⁻ epitaxial growth layer
107, 108, 115, 116, 148 . . . N⁺ diffusion region
109, 110, 113, 114, 121, 153 . . . P⁺ diffusion region
111, 112, 122, 143 . . . P diffusion region
117, 120, 146, 147 . . . P⁻ diffusion region
118 . . . P⁻ diffusion region (sixth semiconductor region)
119 . . . P diffusion region (eighth semiconductor region)
123, 124 . . . Gate electrode
125 . . . Gate oxide film
126 . . . First level shift resistor
127 . . . Second level shift resistor
128, 128*c* . . . First diode
128*j*, 128*n* . . . Second diode
128*a*, 128*h* . . . Metal line
128*b*, 128*d*, 128*e*, 128*i* . . . Bonding wire
129 . . . Bootstrap diode
130 . . . First high voltage junction terminating structure
130*a* . . . Second high voltage junction terminating structure
131 . . . Pch level shifter
132 . . . Nch level shifter
133 . . . Low-side circuit region
134 . . . Substrate circuit region
135 . . . High-side circuit region
136 . . . Input control circuit
136*b* . . . Output control circuit
136*c* . . . Input/output control circuit
137 . . . High-side gate driver circuit
137*b* . . . Abnormality detection circuit
137*c* . . . Composite circuit
138 . . . Bootstrap capacitor
139 . . . First level down circuit
139*b* . . . Second level down circuit
140 . . . First level up circuit
140*b* . . . Second level up circuit
141 . . . First parasitic diode
142 . . . Second parasitic diode
128*g*, 149, 149*b*, 149*m* . . . Anode electrode
128*f*, 150, 150*b*, 150*m* . . . Cathode electrode
171 . . . Wiring pattern
172, 172*a* . . . Anode electrode
173 . . . Cathode electrode
180 . . . P⁻ diffusion region
201 . . . Gate resistor
202 . . . Gate protection diode
203 . . . Protective diode
301 . . . High voltage resistor
302 . . . Gate protection diode
303 . . . Protective diode
401 . . . N-type region
500 . . . Power conversion bridge circuit
501 . . . High-side power device
502 . . . Low-side power device
503 . . . Shunt resistor
Q1, Q1*b* . . . First field effect transistor
Q2, Q2*b* . . . Second field effect transistor

What is claimed is:

1. A semiconductor device, comprising:
   a semiconductor layer of a first conductivity type;
   first and second semiconductor regions of a second conductivity type, which are disposed in a front surface layer of the semiconductor layer or on the semiconductor layer and have first and second parasitic diodes formed between the semiconductor layer and the first and second semiconductor regions respectively;
   a control circuit disposed in the first semiconductor region;
   a gate driver circuit disposed in a front surface layer of the second semiconductor region;
   a first diode that is disposed in a surge current path formed by a negative surge voltage and passing through the second parasitic diode, and that has reverse characteristics to a surge current; and
   a level shift circuit that outputs, to the gate driver circuit, a first gate control signal that is output from the control circuit.

2. The semiconductor device according to claim 1, wherein the level shift circuit has a level down circuit that converts a first gate control signal, which is output from the control circuit and has, as a reference potential, a first potential that is a potential of the first semiconductor region, into a second gate control signal which has, as a reference potential, a third potential that is a potential of the semiconductor layer, and a level up circuit that converts the second gate control signal into a third gate control signal which has, as a reference potential, a second potential that is a potential of the second semiconductor region, and outputs the third gate control signal to the gate driver circuit.

3. The semiconductor device according to claim 2, further comprising:
   an abnormality detection circuit that is disposed in the second semiconductor region and operated with a second potential as a reference potential, the second potential being a potential of the fourth semiconductor region; and
   a second level shift circuit that converts a first abnormality detection signal that is output from the abnormality detection circuit and has the second potential as a reference potential into a third abnormality detection signal having the first potential as a reference potential, and then outputs the third abnormality detection signal to the control circuit.

4. The semiconductor device according to claim 1, wherein the level shift circuit has a level up circuit that receives a first gate control signal through a gate resistor, the first gate control signal being output from the control circuit and having, as a reference potential, a first potential that is a potential of the first semiconductor region, converts the first gate control signal into a third gate control signal based on a second potential that is a potential of the second semiconductor region, and outputs the third gate control signal to the gate driver circuit.

5. The semiconductor device according to claim 1, wherein the second semiconductor region is surrounded by a first high voltage junction terminating structure.

6. The semiconductor device according to claim 5, wherein the first semiconductor region is surrounded by a second high voltage junction terminating structure.

7. The semiconductor device according to claim 6, wherein the second high voltage junction terminating structure has:
 a fifth semiconductor region of the second conductivity type that is disposed in the front surface layer of the semiconductor layer or on the semiconductor layer and surrounds the first semiconductor region in contact therewith; and
 a sixth semiconductor region of the first conductivity type that is formed in a front surface layer of the fifth semiconductor region.

8. The semiconductor device according to claim 7, wherein the fifth semiconductor region is formed as a cathode region of the first diode, and the sixth semiconductor region is formed as an anode region of the first diode.

9. The semiconductor device according to claim 1, wherein the first diode is disposed within a semiconductor substrate same as the semiconductor layer.

10. The semiconductor device according to claim 1, wherein the first diode is an external diode.

11. The semiconductor device according to claim 1, wherein
 an anode of the first diode is connected to an anode electrode that is disposed in the front surface layer of the semiconductor layer and used for connecting the anode of the first diode, and
 a cathode of the first diode is connected to a ground terminal or a cathode electrode disposed in a front surface layer of the first semiconductor region, the ground terminal or the cathode electrode being used for connecting the cathode of the first diode.

12. The semiconductor device according to claim 1, further comprising a second diode that has a cathode connected to the second semiconductor region and an anode connected to the semiconductor layer.

13. A semiconductor device, comprising:
 a semiconductor layer of a first conductivity type;
 first and second semiconductor regions of a second conductivity type, which are disposed in a front surface layer of the semiconductor layer or on the semiconductor layer and have first and second parasitic diodes formed between the semiconductor layer and the first and second semiconductor regions respectively;
 a control circuit disposed in the first semiconductor region;
 an abnormality detection circuit disposed in a front surface layer of the second semiconductor region;
 a diode that is disposed in a surge current path formed by a negative surge voltage and passing through the second parasitic diode, and that has reverse characteristics to a surge current; and
 a level shift circuit that outputs, to the control circuit, a first abnormality detection signal that is output from the abnormality detection circuit.

14. The semiconductor device according to claim 13, wherein the level shift circuit has a level down circuit that converts the first abnormality detection signal that is output from the abnormality detection circuit and has a second potential as a reference potential into a second abnormality detection signal based on a third potential which is a floating potential of the semiconductor layer, and a level up circuit that converts the second abnormality detection signal into a third abnormality detection signal based on a first potential and outputs the third abnormality detection signal to the control circuit.

15. The semiconductor device according to claim 13, wherein the second semiconductor region is surrounded by a first high voltage junction terminating structure.

16. The semiconductor device according to claim 15, wherein the first semiconductor region is surrounded by a second high voltage junction terminating structure.

17. The semiconductor device according to claim 13, wherein the diode is disposed within a semiconductor substrate same as the semiconductor layer.

18. The semiconductor device according to claim 13, wherein the diode is an external diode.

* * * * *